United States Patent
Khan

(10) Patent No.: US 11,984,274 B2
(45) Date of Patent: *May 14, 2024

(54) SOLAR CELL HAVING A POROUS SILICON LAYER

(71) Applicant: KING FAHD UNIVERSITY OF PETROLEUM AND MINERALS, Dhahran (SA)

(72) Inventor: Firoz Khan, Dhahran (SA)

(73) Assignee: KING FAHD UNIVERSITY OF PETROLEUM AND MINERALS, Dhahran (SA)

(*) Notice: Subject to any disclaimer, the term of this patent is extended or adjusted under 35 U.S.C. 154(b) by 0 days.

This patent is subject to a terminal disclaimer.

(21) Appl. No.: 18/316,260

(22) Filed: May 12, 2023

(65) Prior Publication Data

US 2024/0021377 A1     Jan. 18, 2024

Related U.S. Application Data

(63) Continuation of application No. 17/863,009, filed on Jul. 12, 2022, now Pat. No. 11,756,744.

(51) Int. Cl.
*H01L 31/00*     (2006.01)
*H01G 9/20*     (2006.01)
(Continued)

(52) U.S. Cl.
CPC ........... *H01G 9/2072* (2013.01); *H01G 9/209* (2013.01); *H10K 30/10* (2023.02); *H10K 30/82* (2023.02); *H10K 85/30* (2023.02)

(58) Field of Classification Search
CPC ...... H01G 9/2072; H01G 9/209; H10K 30/82; H10K 30/10; H10K 85/30
See application file for complete search history.

(56) References Cited

U.S. PATENT DOCUMENTS 11,756,744 B1 *   9/2023   Khan .................. H01G 9/2072
                                                              136/255
2018/0019361 A1    1/2018   Mishima et al.
(Continued)

FOREIGN PATENT DOCUMENTS

CN          113745366 A      12/2021
EP          3 270 432 B1      7/2019
KR    10-2019-0119073      10/2019

OTHER PUBLICATIONS

Akhil, et al. ; Review on perovskite silicon tandem solar cells: Status and prospects 2T, 3T and 4T for real world conditions ; Materials & Design 211 ; Sep. 29, 2021 ; 36 Pages.
(Continued)

*Primary Examiner* — Thanh Truc Trinh
(74) *Attorney, Agent, or Firm* — Oblon, McClelland, Maier & Neustadt, L.L.P.

(57) ABSTRACT

A three-tandem (3T) perovskite/silicon (PVT)-based tandem solar cell (TSC) includes an antireflection coating (ARC), a first transparent conductive oxide layer (TCO), a hole transport layer (HTL), a perovskite (PVT) layer, a second transparent conductive oxide layer (TCO), an electron transport layer (ETL), a plurality of buried contacts, a p-type Si layer, a p-type wafer-based homo-junction silicon solar cell, a n+ silicon layer, a back contact layer. The solar cell further includes a top sub-cell, a bottom sub-cell and a middle contact-based tandem. The top sub-cell includes the PVT layer. The bottom sub-cell includes the silicon solar cell. The middle contact-based tandem includes the second TCO layer to be used as the middle contact-based tandem, as well as a recombination layer for current collection. Further, a conduction and a valence band edge are employed at a front surface of the ETL.

15 Claims, 10 Drawing Sheets

(51) Int. Cl.
*H10K 30/10* (2023.01)
*H10K 30/82* (2023.01)
*H10K 85/30* (2023.01)

(56) References Cited

U.S. PATENT DOCUMENTS

2022/0005965 A1  1/2022  Uzu et al.
2022/0045130 A1  2/2022  Hilt et al.

OTHER PUBLICATIONS

Singh, et al.; Comparing optical performance of a wide range of perovskite/silicon tandem architectures under real-world conditions; Nanophotonics 10(8); pp. 2043-0257; Mar. 17, 2021; 15 Pages.

* cited by examiner

SOLAR CELL HAVING A POROUS SILICON LAYER

CROSS-REFERENCE TO RELATED APPLICATIONS

The present application is a Continuation of U.S. application Ser. No. 17/863,009, now allowed, having a filing date of Jul. 12, 2022.

BACKGROUND

Technical Field

The present disclosure is directed to a solar cell, and particularly to a three-tandem (3T) perovskite/silicon (PVT)-based tandem solar cell.

Description of Related Art

The "background" description provided herein presents the disclosure context generally. Work of the presently named inventors, to the extent it is described in this background section, and aspects of the description that may not otherwise qualify as prior art at the time of filing, are neither expressly nor impliedly admitted as prior art against the present invention.

A solar cell utilizing an organic metal perovskite crystal material (perovskite-type solar cell) or other organic and/or inorganic hybrid (OIH) materials can provide high conversion efficiency. Perovskite (PVT)-based tandem solar cells (TSCs) are emerging as a leading photovoltaic (PV) technology and have the potential to cross the Shockley-Queisser (S-Q) theoretical limit of a single-junction silicon solar cell. However, 2-terminal (2T) and 4T PVT/Si TSCs have one or more limitations, such as low power conversion efficiency ($\eta$) and high manufacturing costs. Furthermore, the 2T and 4T PVT/Si TSCs may include materials that are inefficient solar radiation absorbers. Hence, there is a need for a simple, an efficient, and an inexpensive solar cell that may overcome the limitations above.

Therefore, it is one object of the present disclosure to provide a simple and efficient solar cell with high power conversion efficiency and low manufacturing costs.

SUMMARY

In an exemplary embodiment, a three-tandem (3T) perovskite/silicon (PVT)-based tandem solar cell (TSC) is described. The solar cell includes an antireflection coating (ARC). The solar cell includes a first transparent conductive oxide layer (TCO). The ARC is adjacent and above the TCO. The solar cell further includes a hole transport layer (HTL). The TCO is adjacent and above the HTL. The solar cell further includes a perovskite (PVT) layer. The HTL is adjacent and above the PVT layer. The solar cell includes a second transparent conductive oxide layer (TCO). The PVT layer is adjacent and above the second TCO. The solar cell further includes an electron transport layer (ETL) including a porous silicon surface. The second TCO layer is adjacent and above the ETL. The solar cell further includes a plurality of buried contacts including silicon nanowires and are disposed in and pass through the ETL into the second TCO and into a p-type Si layer. The solar cell includes a p-type wafer-based homo-junction silicon solar cell with the buried contacts being in point contact configuration with the ETL. The ETL is adjacent and above the p-type silicon solar cell. The solar cell further includes a $n^+$ silicon layer. The p-type silicon solar cell is adjacent and above the $n^+$ silicon layer. The solar cell includes a back contact layer. The $n^+$ silicon layer is adjacent and above the back contact layer, which uses an internal thermal barrier. The three-tandem (3T) perovskite/silicon (PVT)-based tandem solar cell (TSC) has a top sub-cell, a bottom sub-cell and a middle contact-based tandem. The top sub-cell includes the PVT layer. The bottom sub-cell includes the silicon solar cell. The middle contact-based tandem includes the second TCO layer to be used as the middle contact-based tandem, as well as a recombination layer for current collection. A conduction and a valence band edge are employed at a front surface of the ETL. The porous silicon surface is directly grown on a surface of the silicon solar cell. The band edge is tuned by varying a porosity of the porous silicon surface.

In some embodiments, the bottom sub-cell includes a CZ crystalline silicon (CZ c-Si).

In some embodiments, the bottom sub-cell includes a multi-crystalline silicon (mc-Si).

In some embodiments, the first and second TCO layers are fluorine or indium doped tin oxide (FTO or ITO).

In some embodiments, the first TCO layer is a hydrogenated indium oxide.

In some embodiments, the top sub-cell includes an organic or inorganic perovskite.

In some embodiments, the PVT layer includes one or more perovskites having a formula $ABX_3$. Where A is a monovalent cation selected from the group consisting of methylammonium ($MA^+$:$CH_3NH_3^+$), formamidinium ($FA^+$: $HC(NH_2)_2^+$), cesium ($Cs^+$), and rubidium ($Rb^+$). B is a divalent metal cation selected from the group consisting of $Pb^{2+}$, $Sn^{2+}$, and $Ge^{2+}$, and X is a halide anion selected from the group consisting of $Cl^-$, $Br^-$, and $I^-$.

In some embodiments, the porous silicon surface uses an optical band-edge shifting property to directly extract light-generated charge carriers.

In some embodiments, the bottom sub-cell contributes less than half of a total efficiency of the TSC.

In some embodiments, the second TCO layer has a gridded metal contact disposed adjacent to a surface of the second TCO layer.

In some embodiments, the p-type silicon solar cell has a resistivity of from 1 (ohm-centimeters) $\Omega$-cm to 10 $\Omega$-cm.

In some embodiments, the p-type silicon solar cell has a thickness of from 175 micrometers ($\mu$m) to 225 $\mu$m.

In some embodiments, the solar cell further includes at least one of a $SiO_2$ layer or $Al_2O_3$ layer on the porous silicon surface.

In some embodiments, the $SiO_2$ or $Al_2O_3$ layer is at most 10 nanometers (nm).

In some embodiments, the HTL includes a hole-transmitting material (HTM).

In some embodiments, the HTM is selected from the group consisting of NiO, NiO:Cu, and $WO_3$.

The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
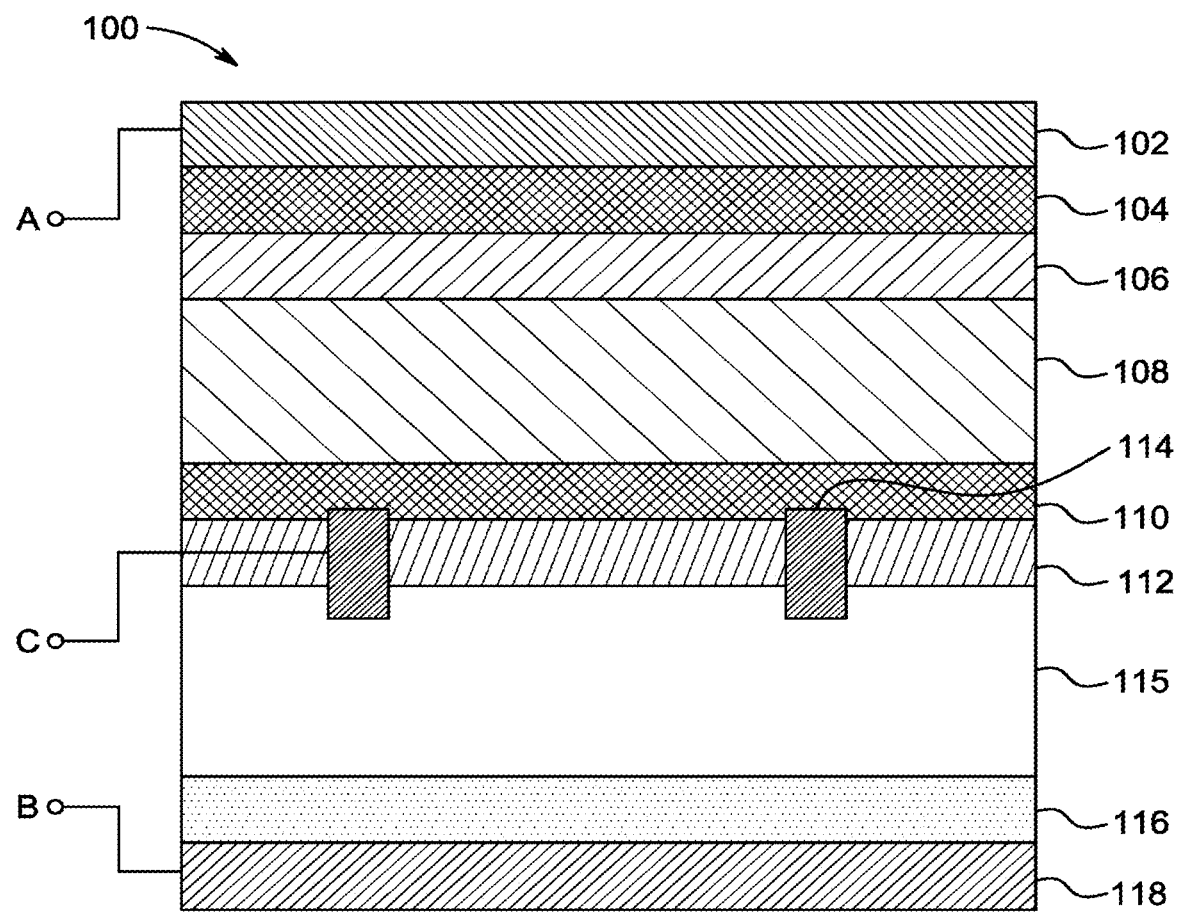
FIG. 1 is a schematic drawing of a three-tandem (3T) perovskite/silicon (PVT)-based tandem solar cell (TSC), according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values there between.

Aspects of the present disclosure are directed towards a three-tandem (3T) perovskite/silicon (PVT)-based tandem solar cell (TSC), otherwise referred to as the 'solar cell'. A solar cell, or photovoltaic cell, is an electrical device that converts light energy directly into electricity by the photovoltaic effect, which is a physical and chemical phenomenon. Experimental observations for the solar cell components demonstrated a significant increase in power conversion efficiency (f). In addition, the solar cell exhibits more extended service life at low costs, thereby circumventing the drawbacks such as high manufacturing cost and low power conversion properties of the prior art.

FIG. 1 refers to a schematic drawing of a three-tandem (3T) perovskite/silicon (PVT)-based tandem solar cell (TSC) 100. The solar cell 100 includes an anti-reflection coating (ARC) 102. The ARC 102 reduces reflection and increases light absorption and performance of the solar cell 100. In some embodiments, the ARC layer 102 may include silicon dioxide. In some embodiments, the ARC 102 has a thickness of from 60 micrometers (μm) to 120 μm, preferably 70 μm to 110 μm, preferably 80 μm to 100 μm, or 90 μm. In some embodiments, the ARC 102 may further include titanium dioxide. In some embodiments, the ARC 102 may include LiF or $MgF_2$. In some embodiments, the ARC 102 may include $MgF_2$, $SiN_x$, $SiO_2$, $TiZrO_2$, ZnS, SiN, $CeO_2$, ITO, $Si_3N_4$, ZnO, $TiO_2$, a fluoropolymer (PTFE, PVdF, PHFP, etc.), spirooxazine-doped polystyrene, vinyltrimethoxy silane films, or $AlN_x$ wherein x may be any integer from 1 to 10.

The solar cell 100 includes a first transparent conductive oxide layer (TCO) 104. The first TCO layer 104 is an electrically conductive material with comparably low absorption of light. The first TCO layer 104 may include a chemical formula of $A_xB_y$, where A is a metal, B is a non-metal such as oxygen, X and Y are atoms of the corresponding elements. The formula of the first TCO layer 104 may further be changed to a formula $A_yB_z$:D on doping. The ARC 102 is adjacent and above the first TCO layer 104 and directly contacts the first TCO layer 104. In some embodiments, the refractive index of the ARC 102 is lower than a refractive index of the first TCO layer 104. In some embodiments, the ARC 102 is a material with an index of refraction of 1.23±0.01, 0.02, 0.03, 0.04, 0.05, 0.06, 0.07, 0.075, 0.08, 0.09, 0.1, 0.11, 0.125, 0.133, 0.14, or 0.15, or some range including any of these endpoints, different from the layer immediately beneath it, the first TCO layer 104. In some embodiments, the first TCO layer 104 has a thickness of from 60 micrometers (μm) to 120 μm, preferably 70 μm to 110 μm, preferably 80 μm to 100 μm, or 90 μm.

A dopant may be added to the first TCO layer 104. For example, when zinc oxide is used for the first TCO layer 104, examples of the dopant may include aluminum, gallium, boron, silicon, and carbon. When indium oxide is used for the first TCO layer 104, examples of the dopant may include zinc, tin, titanium, tungsten, molybdenum, and silicon. When tin oxide is used for the first TCO layer 104, examples of the dopant may include fluorine. In some embodiments, the first TCO layer 104 layer may be a hydrogenated indium oxide. In some embodiments, the first TCO layer 104 is fabricated of indium tin oxide (ITO), indium zinc oxide (IZO), aluminum-doped zinc oxide (AZO), gallium-doped zinc oxide (GZO), indium cerium oxide (ICO), indium tungsten oxide (IWO), zinc indium tin oxide (ZITO), zinc indium oxide (ZIO), zinc tin oxide (ZIO), GITO (gallium indium tin oxide), gallium indium oxide (GIO), gallium zinc oxide (GZO), aluminum-doped zinc oxide (AZO), fluorinated tin oxide (FTO), ZnO, or and/or indium-doped cadmium oxide (ICO), and can be deposited via thermal evaporation or sputtering.

The solar cell 100 further includes a hole transport layer (HTL) 106. In some embodiments, the HTL 106 may include an organic HTL material. In some embodiments, the HTL 106 may include an inorganic HTL material. In some embodiments, the HTL 106 may be selected from the group of 1,3-bis(N-carbazolyl)benzene, 4,4'-bis(N-carbazolyl)-1,1'-biphenyl, 2,6-bis(9H-carbazol-9-yl)pyridine, 1,4-bis(diphenylamino)benzene, 4,4'-bis(3-ethyl-N-carbazolyl)-1,1'-biphenyl, N,N'-bis(3-methylphenyl)-N,N'-diphenylbenzidine,(E,E)-1,4-bis[2-[4-[N,N-bis(4-methoxyphenyl) amino]phenyl]vinyl]benzene (TOP-HTM-al), (E,E,E,E)-4, 4',4'',4'''-[benzene-1,2,4,5-tetrayltetrakis(ethene-2,1-diyl)]

tetrakis[N,N-bis(4-methoxyphenyl)aniline](TOP-HTM-α2), copper(II) phthalocyanine, cuprous thiocyanate, copper indium sulfide, cuprous iodide, 4,4'-cyclohexylidenebis[N,N-bis(4-methylphenyl)benzenamine], 4-(dibenzylamino)benzaldehyde-N,N-diphenylhydrazone, 9,9'-(2,2'-dimethyl[1,1'-biphenyl]-4,4'-diyl)bis-9H-carbazole, 2,2'-dimethyl-N,N'-di-[(1-naphthyl)-N,N'-diphenyl]-1,1'-biphenyl-4,4'-diamine, 9,9-dimethyl-N,N'-di(1-naphthyl)-N,N'-diphenyl-9H-fluorene-2,7-diamine, N,N'-di(1-naphthyl)-N,N'-diphenyl-(1,1'-biphenyl)-4,4'-diamine, N,N'-diphenyl-N,N'-bis-[4-(phenyl-m-tolylamino)phenyl]biphenyl-4,4'-diamine, N,N'-diphenyl-N,N'-di-p-tolylbenzene-1,4-diamine, dipyrazino[2,3-f:2',3'-h]quinoxaline-2,3,6,7,10,11-hexacarbonitrile, $N^4,N^{4'}$-bis[4-[bis(3-methylphenyl)amino]phenyl]-$N^4,N^{4'}$-diphenyl-[1,1'-biphenyl]-4,4'-diamine (DNTPD), 3-(4,6-diphenyl-1,3,5-triazin-2-yl)-9-phenyl-9H-carbazole (DPTPCz), 9-(2-ethylhexyl)-N,N,N,N-tetrakis((4-methoxyphenyl)-9H-carbazole-2,7-diamine) (EH44), indium(III) phthalocyanine chloride, lead phthalocyanine, poly(copper phthalocyanine), poly(N-ethyl-2-vinylcarbazole), poly-4-butyl-N,N-diphenylaniline (TPD),poly(9-vinylcarbazole), poly(1-vinylnaphthalene),2,8-bis(diphenylphosphineoxide)dibenzofuran(PPF),poly[bis(4-phenyl)(2,4,6-trimethylphenyl)amine](PTAA), $N_2,N_2,N_2',N_2',N_7,N_7,N_7',N_7'$-octakis(4-methoxyphenyl)-9,9'-spirobi[9H-fluorene]-2,2',7,7'-tetramine (Spiro-MeOTAD, also sold as SHT-263 Solarpur® HTM),spiro[9H-fluorene-9,9'-[9H]xanthene]-2,7-diamine, spiro[9H-fluorene-9,9'-[9H]xanthene]-2,2',7,7'-tetramine, 2,4,6-tris(3-(carbazol-9-yl)phenyl)triazine(TCPZ),N,N,N',N'-tetrakis(4-methoxyphenyl) benzidine,N,N,N',N'-tetrakis(3-methylphenyl)-3,3'-dimethylbenzidine, N,N,N',N'-tetrakis(2-naphthyl)benzidine,tetra-N-phenylbenzidine,N,N,N',N'-tetraphenylnapthalene-2,6-diamine,poly[(9,9-dioctylfluorenyl-2,7-diyl)-co-(4,4'-(N-(4-sec-butylphenyl)diphenylamine)](TFB), tin(IV) 2,3-naphthalocyanine dichloride, titanyl phthalocyanine, titanium oxide phthalocyanine, tris(4-carbazoyl-9-ylphenyl)amine, tris[4-(diethylamino)phenyl]amine, 1,3,5-tris(diphenylamino)benzene, 1,3,5-tris(2-(9-ethylcabazyl-3)ethylene)benzene,1,3,5-tris[(3-methylphenyl)phenylamino]benzene,4,4',4''-Tris[2-naphthyl(phenyl)amino]triphenylamine,4,4',4''-tris[phenyl(m-tolyl)amino]-triphenylamine, vanadyl phthalocyanine, zinc phthalocyanine, or combinations of any of these. In some embodiment, the HTL 106 may include one or more additives to reduce resistivity. The one or more additives may include solid additives such as Li-bis(trifluoromethanesulfonyl)imide (Li-TFSI), liquid additives such as 4-tert-butylpyridine (tBP), and metal complexes including Co. In some embodiments, the HTL layer 106 has a thickness of from 60 micrometers (μm) to 120 μm, preferably 70 μm to 110 μm, preferably 80 μm to 100 μm, or 90 μm.

The first TCO layer 104 is adjacent and above the HTL 106. In some embodiments, the first TCO layer 104 directly contacts the HTL 106. In some embodiments, the HTL 106 includes a hole-transmitting material (HTM). In some embodiments, the HTM is selected from the group consisting of NiO, NiO:Cu, and $WO_3$, and further can be selected from the generic list of $NiO_x$, $NiO:Cu_x$, or $WO_x$, wherein x is an integer between 1 and 10. The solar cell 100 further includes a perovskite (PVT) layer 108. The HTL 106 is adjacent and above the PVT layer 108. In some embodiments, the HTL 106 directly contacts the PVT layer 108. In some embodiments, the PVT layer 108 includes one or more perovskites having a formula $ABX_3$. Where A is a monovalent cation selected from the group consisting of methylammonium ($MA^+$:$CH_3NH_3^+$), formamidinium ($FA^+$:$HC(NH_2)_2^{2+}$), cesium ($Cs^+$), and rubidium ($Rb^+$), B is a divalent metal cation selected from the group consisting of $Pb^{2+}$, $Sn^{2+}$, and $Ge^{2+}$, and X is a halide anion selected from the group consisting of $Cl^-$, $Br^-$, and $I^-$. In alternate embodiments, the cation 'A' is inorganic, the cation can be selected from the group consisting of Ag+, Li+, Na+, K+, Be2+, Mg2+, Ca2+, Pb2+, Sr2+, Ba2+, Fe2+, Sc3+, Y3+, and La3+. The cation can be used as a single or multiple ion (e.g. (Mg,Fe)SiO3), YBaCuO3). In some embodiments, the PVT layer 108 has a thickness of from 120 micrometers (μm) to 240 μm, preferably 130 μm to 230 μm, preferably 140 μm to 220 μm, preferably 150 μm to 210 μm, preferably 160 μm to 200 μm, preferably 170 μm to 190 μm, or 180 μm.

In some embodiments, the formula $ABX_3$ may also be interchangeably referred to as the formula $RNH_3MX_3$, where R is an alkyl group, preferably an alkyl group having 1 to 10 carbon atoms, and particularly preferably a methyl group, M is same as that of the B of the formula $ABX_3$. Non-limiting examples of an alkyl group include ethyl, propyl, isopropyl, butyl, isobutyl, sec-butyl, tert-butyl, and the higher homologs and isomers.

The solar cell 100 includes a second transparent conductive oxide layer (TCO) 110. The PVT layer 108 is adjacent and above the second TCO layer 110. In some embodiments, the PVT layer 108 directly contacts the second TCO layer 110. The second TCO layer 110 may include a chemical formula of $A_xB_y$, where A is a metal, B is a non-metal such as oxygen, X and Y are atoms of the corresponding elements. The formula of the second TCO layer 110 may further be changed to a formula $A_yB_z$:D on doping. A dopant may be added to the second TCO layer 110. For example, when zinc oxide is used for the second TCO layer 110, examples of the dopant may include aluminum, gallium, boron, silicon, and carbon. When indium oxide is used for the second TCO layer 110, examples of the dopant may include zinc, tin, titanium, tungsten, molybdenum, and silicon. When tin oxide is used for the second TCO layer 110, examples of the dopant may include fluorine. In some embodiments, the second TCO layer 110 layer may be a hydrogenated indium oxide. In some embodiments, the second TCO layer 110 has a thickness of from 50 micrometers (μm) to 100 μm, preferably 57.5 μm to 92.5 μm, preferably 65 μm to 85 μm, or 75 μm. In some embodiments, the second TCO layer 110 has a gridded metal contact disposed adjacent to a surface of the second TCO layer 110. In some embodiments, the gridded metal contact is fabricated of Ag, Sm, Sc, Gd, Er, or other precious metals. The solar cell 100 further includes an electron transport layer (ETL) 112. In some embodiments, the ETL 112 may be selected from one or more materials such as graphene, graphite, graphene oxide, zirconia, titanium oxide, zinc oxide, niobium oxide, zirconium oxide, and aluminum oxide. In some embodiments, the ETL 112 may include a donor. For example, when titanium oxide is used for the ETL 112, examples of the donor may include yttrium, europium, and terbium. In some embodiments, the ETL layer 112 has a thickness of from 60 micrometers (μm) to 120 μm, preferably 70 μm to 110 μm, preferably 80 μm to 100 μm, or 90 μm.

The ETL 112 may be a dense layer having a smooth structure, or porous layer having a porous structure. When the ETL 112 has a porous structure, the micropore size is preferably on the nanoscale, in a range from 1 nm to 2 nm, preferably 1.1 nm to 1.9 nm, preferably 1.2 nm to 1.8 nm, preferably 1.3 nm to 1.7 nm, preferably 1.4 nm to 1.6 nm, or 1.5 nm. In some embodiments, the ETL has a mesopore size ranging from 2 nm to 50 nm, preferably 5 nm to 45 nm, preferably 10 nm to 40 nm, preferably 15 nm to 35 nm, preferably 20 nm to 30 nm, or 25 nm. In some embodiments, the ETL 112 includes a porous silicon surface. In some embodiments, the porous silicon surface uses an optical band-edge shifting property to directly extract light-generated charge carriers. The shifting property refers to optical recombination, and/or resistive losses that are to be reduced with the present disclosure. Aspects of the present disclosure enhance the open circuit voltage ($V_{oc}$), e.g., via surface modification of silicon, optionally further enhancing the open circuit voltage ($V_{oc}$) of the tandem cell. The porous silicon surface increases the active surface area of the light absorbing layer to improve the collectiveness of electrons by the ETL 112, thus porous silicon surface can directly produce current via light absorption. In some embodiments, The ETC layer 112 may comprises at least 90 wt. % p⁺-porous silicon, relative to total electron transport layer weight. In some embodiments, the ETC layer 112 comprises no filler. In some embodiments, the ETC layer 112 may comprise no perovskite material beyond a depth of 10% of an ETC layer thickness. In some embodiments, the porosities of the porous silicon in the ETC layer 112 may involve, e.g., at least 1, 2.5, 5, 7.5, 10, 12.5, 15, 17.5, 20, 22.5, 25, 27.5, 30, 35, 40, 45, or 50 vol. % (void) and/or up to 95, 90, 85, 80, 75, 70, 65, 60, 55, 50, 45, 40, 35, 30, or 25%. In some embodiments, the shift in the energy levels of the conduction band minimum (CBM) and the valence band maximum (VBM) of porous silicon (PS) are in an approximate ratio of 1/2.6, e.g., 1 to at least 2.25, 2.3, 2.33, 2.35, 2.4, 2.45, 2.5, 2.525, 2.55, 2.575, 2.6, 2.625, or 2.65 and/or up to 2.9, 2.85, 2.8, 2.775, 2.75, 2.725, 2.7, 2.675, 2.65, 2.625, 2.6, 2.575, or 2.55. Due to the band mismatch of porous silicon with PVT 108, minimal interfacial layers are required to transport electrons (or holes) from the porous silicon (or PVT 108) to PVT 108 (or porous silicon), ranging from 1 to 3 interfacial layers, or 2 layers, thereby reducing material and processing costs.

The second TCO layer 110 is adjacent and above the ETL 112. In some embodiments, the second TCO layer 110 is in direct contact with the ETL 112. The solar cell 100 further includes a plurality of buried contacts 114 in the form of silicon nanowires and are disposed in and pass through the ETL 112 into the second TCO layer 110 and into a p-type Si layer. In some embodiments, the buried contacts 114 in the form of silicon nanowires have a diameter of from 0.5 μm to 1.5 μm, preferably 0.6 μm to 1.4 μm, preferably 0.7 μm to 1.3 μm, preferably 0.8 to 1.2 μm, preferably 0.9 μm to 1.1 μm, or 1 μm. In alternate embodiments, the nanowires are formed of titanium nitride, germanium, or manganese. In some embodiments, the buried contacts 114 have a height ranging from 60 micrometers (μm) to 120 μm, preferably 70 μm to 110 μm, preferably 80 μm to 100 μm, or 90 μm. In some embodiments, the buried contacts 114 penetrate to a depth ranging from 2 micrometers (μm) to 20 μm into the second TCO layer 110, preferably 4 μm to 18 μm, preferably 6 μm to 14 μm, preferably 8 μm to 12 μm, or 10 μm. In some embodiments, the first TCO layer 104 and the second TCO layer 110 are fluorine or indium doped tin oxide (FTO or ITO). In some embodiments, the first TCO layer 104 and the second TCO layer 110 are doped using zinc oxide. The solar cell 100 includes a p-type wafer-based homo-junction silicon solar cell, also referred to as the p-type silicon solar cell 115. The buried contact 114 is in point contact configuration with the ETL 112. In some embodiments, the buried contacts 114 penetrate to a depth ranging from 2 micrometers (μm) to 20 μm into the p-type silicon solar cell 115, preferably 4 μm to 18 μm, preferably 6 μm to 14 μm, preferably 8 μm to 12 μm, or 10 μm. In some embodiments, the buried contacts 114 penetrate the entire thickness of the ETL 112. In alternate embodiments, the buried contacts 114 penetrate between 70% to 95% of the thickness of the ETL 112, preferably 72.5% to 92.5%, preferably 75% to 90%, preferably 77.5% to 87.5%, preferably 80% to 85%, or 82.5%.

The ETL 112 is adjacent and above the p-type silicon solar cell 115. In some embodiments, the ETL 112 is in direct contact with the solar cell 115. In some embodiments, p-type silicon solar cell 115 has a thickness of from 150 micrometers (μm) to 300 μm, preferably 175 μm to 275 μm, preferably 200 μm to 250 μm, or 225 μm. In preferred embodiments, the p-type silicon solar cell has a thickness of from 175 micrometers (μm) to 225 μm, preferably 180 μm to 220 μm, preferably 185 μm to 215 μm, preferably 190 μm to 210 μm, preferably 195 μm to 205 μm, or 200 μm. In some embodiments, the p-type silicon solar cell 115 has a resistivity of from 1 (ohm-centimeters) Ω-cm to 10 Ω-cm, preferably 2 Ω-cm to 9 Ω-cm, preferably 3 Ω-cm to 8 Ω-cm, preferably 4 Ω-cm to 7 Ω-cm, preferably 5 Ω-cm to 6 Ω-cm, or 5.5 Ω-cm. In some embodiments, the resistivity of the p-type silicon solar cell 115 may lie in a range of about 3 Ω-cm to about 8 Ω-cm, preferably 3.5 Ω-cm to 7.5 Ω-cm, preferably 4 Ω-cm to 7 Ω-cm, preferably 4.5 Ω-cm to 6.5 Ω-cm, preferably 5 Ω-cm to 6 Ω-cm, or 5.5 Ω-cm. The p-type cell layer 115 may be made for example of one among the following elements: Nickel oxide "$NiO_x$", Molybdenum oxide "$MoO_x$", Tungsten oxide "$WO_x$", 2,2', 7,7'-Tetrakis-(N,N-di-4-methoxyphenylamino)-9,9'-spirobifluorene, poly(triarylamine) "PTAA", poly(3-hexylthiophene) "P3HT", poly(3,4-ethylenedioxythiophene) doped with poly(styrene sulfonate) "PEDOT:PSS", Copper(I) thiocyanate "CuSCN", Cobalt oxide "$CoO_x$", Chromium oxide "$CrO_x$", Copper(I) iodide "CuI", Copper sulfide "CuS", Copper oxide "$CuO_x$", or Vanadium oxide "$Vo_x$", wherein x is an integer between 1 and 10.

The solar cell 100 further includes a n+ silicon layer 116. The p-type silicon solar cell 115 is adjacent and above the n+ silicon layer 116. In some embodiments, the solar cell 115 is in direct contact with the silicon layer 116. In some embodiments, p-type silicon solar cell 115 has a first polarity that is different from n+ silicon layer 116 which has a second polarity. In some embodiments, the n+ silicon layer 116 has a thickness of from 60 micrometers (μm) to 120 μm, preferably 70 μm to 110 μm, preferably 80 μm to 100 μm, or 90 μm. The solar cell 100 includes a back contact layer 118. In some embodiments, the n-type layer 116 may be made for example of one among the following elements: Tin oxide "$SnO_x$", Titanium oxide "$TiO_x$", Zinc oxide "$ZnO_x$", carbon, $C_{60}$ and derivatives, Zirconia "$ZrO_x$", graphite, graphene, or graphene oxide "rGO", wherein x is an integer between 1 and 10. The n+ silicon layer 116 is adjacent and above the back contact layer 118, which uses an internal thermal barrier. The internal thermal layer can be defined as a layer that prevents heat transfer between neighboring layers or adjacent ambient air, limiting vast gradient temperature differences that may improve the material protection. In some embodiments, the back contact layer 118 has a polyurethane foam thermal layer sprayed onto it, ranging from 0.5 μm to 1.5 μm in thickness, preferably 0.6 μm to 1.4 μm, preferably 0.7 μm to 1.3 μm, preferably 0.8 to 1.2 μm, preferably 0.9 μm to 1.1 μm, or 1 μm. In some embodiments, the silicon layer 116 is in direct contact with the back contact layer 118. In some embodiments, the back contact layer 118 has a thickness of from 60 micrometers (μm) to 120 μm, preferably 70 μm to 110 μm, preferably 80 μm to 100 μm, or 90 μm. The solar cell 100 includes a back contact layer 118. In some embodiments, the back contact layer is made of aluminum, titanium, or silver. In alternate embodiments, the back contact layer 118 comprises a percentage of silicon and can be obtained by phase vapor deposition (PVD).

The three-tandem (3T) perovskite/silicon (PVT)-based tandem solar cell (TSC) 100 has a top sub-cell (A), a bottom sub-cell (B), and a middle contact-based tandem (C). The top sub-cell includes the PVT layer. In some embodiments, the top sub-cell includes an organic or inorganic perovskite.

The bottom sub-cell includes the silicon solar cell. In some embodiments, the bottom sub-cell includes a Czochralski (CZ) crystalline silicon (CZ c-Si). In some embodiments, the c-Si may be a single-crystalline, or microcrystalline. In some embodiments, the bottom sub-cell includes a multi-crystalline silicon (mc-Si). In some embodiments, the bottom sub-cell may include amorphous silicon (a-Si). In some embodiments, the bottom sub-cell contributes less than half of a total efficiency of the TSC.

The middle contact-based tandem includes the second TCO layer 110 to be used as the middle contact-based tandem, as well as a recombination layer for current collection. A conduction and a valence band edge are employed at a front surface of the ETL 112. The porous silicon surface is directly grown on a surface of the silicon solar cell. The band edge is tuned by varying a porosity of the porous silicon surface. The porous silicon layer can be directly grown or tuned on the surface of the silicon via electrochemical etching or chemical etching, so that no interface exists between the porous silicon surface and the second TCO layer, for easier charge transportation. In some embodiments, the electrochemical etching includes a single compartment Teflon cell using a two-electrode arrangement. A silicon wafer is the working electrode, while Pt metal wire or foil acts as the counter electrode. The electrolyte is of a mixture of hydrofluoric acid (HF) and ethanol ($C_2H_5OH$) (or HF, ethanol, and deionized water (DIW)) in various ratios, preferably 1:2 to 1:20 by volume, preferably 1:4 to 1:18, preferably 1:6 to 1:16, preferably 1:8 to 1:14, or 1:10. By applying various current densities, 1 to 100 mA/cm², preferably 10 to 90 mA/cm², preferably 20 to 80 mA/cm², preferably 30 to 70 mA/cm², preferably 40 to 60 mA/cm², or 50 mA/cm², for 5 s to 1000 s, preferably 100 s to 900 s, preferably 200 s to 800 s, preferably 300 s to 700 s, preferably 400 s to 600s, or 500 s. In a preferred embodiment, the current density ranges from 2 to 10 mA/cm² for 5 s to 20 s. In some embodiments, the chemical etching includes dipping a silicon wafer in HF, $HNO_3$, and DIW using various compositions by volume (ratios), for various etching times, preferably 2 s to 60 s, preferably 5 s to 55 s, preferably 10 s to 50 s, preferably 15 s to 45 s, preferably 20 s to 40 s, preferably 25 s to 35 s, or 30 s. In this chemical etching process, $HNO_3$ oxidizes the silicon surface to $SiO_2$. In alternate chemical etching processes, silver nanoparticles (NPs) are uniformly deposited onto the porous substrate using an aqueous solution of $AgNO_3$ and HF. The $AgNO_3$ concentration ranges from 0.01 to 0.04 M, preferably 0.0125 M to 0.0375 M, preferably 0.015 M to 0.035 M, preferably 0.0175 M to 0.0325 M, preferably 0.02 M to 0.03 M, preferably 0.0225 M to 0.0275 M, or 0.025 M and HF concentration ranges from 1-10 M, preferably 2 M to 9 M, preferably 3 M to 8 M, preferably 4 M to 7 M, preferably 5 M to 6 M, or 5.5 M. In the etching deposition process, the Ag ions capture electrons from Si and reduce them to Ag metal NPs. The nanoparticles are deposited on silicon surfaces. In some embodiments, the etching was performed at room temperature in a mixed solution of DIW, HF (4.6 M) and $H_2O_2$(0.5 M) to obtain a porous silicon surface for a short etching time 1 to 10 s, preferably 2 to 9 s, preferably 3 to 8 s, preferably 4 to 7 s, or 5 s. After the electroless etching, the samples are dipped in concentrated $HNO_3$ for 10 min to completely remove the remaining Ag NPs, then rinsed in DIW, and dried in air.

In some embodiments, the solar cell 100 further includes at least one of a $SiO_2$ layer or $Al_2O_3$ layer on the porous silicon surface. In some embodiments, the $SiO_2$ or $Al_2O_3$ layer is at most 10 nanometers (nm). In some embodiments, the $SiO_2$ or $Al_2O_3$ layer is 8 nm.

Examples

The following examples describe and demonstrate exemplary embodiments of the solar cell described herein. The examples are provided solely for the purpose of illustration and are not to be construed as limitations of the present disclosure, as many variations thereof are possible without departing from the spirit and scope of the present disclosure.

Multijunction TSC

Various solar cells are integrated into a tandem architecture, also referred to as the multi-junction (MJ) solar cells. The MJ solar cells include two or more single-junction (SJ) solar cells, including multiple absorber layers with a complementary absorption range. Such a solar concept, which separates the absorption of a polychromatic solar spectrum into several bandgaps, is referred to as the TSCs. The TSCs increase power conversion efficiency ($\eta$) beyond the S-Q limit. In some embodiments, the multi-junction solar cells based on III-V semiconductors which are highly efficient and up to five different absorber layers are integrated into a single device. Typically, a double junction TSC is composed of two sub-cells, having a front cell, also referred to as the top sub-cell of a bandgap (~1.5-1.9 eV), and a rear cell, also referred to as the bottom sub-cell of a bandgap (~0.9-1.3 eV). The top sub-cell absorbs high-energy photons and transmits low-energy photons which are absorbed by the bottom sub-cell. Therefore, compared to single-junction solar cells, the TSCs allow maximum absorption of the solar spectrum by minimizing the thermal energy losses of photogenerated carriers. In some embodiments, the MJ solar cells may include a monolithic MJ solar cell in which two or more SJ solar cells are electrically series-connected via a tunnel junction (TJ) or a recombination layer (RL). The monolithic MJ solar cell has two terminals. In some embodiments, the MJ solar cells may include mechanically stacked MJ solar cells in which two or more SJ solar cells are mechanically stacked (not internally connected via TJ). The mechanically stacked MJ solar cells have multi-terminals (2×number of SJ sub-cells).

Perovskite-Based TSCs

Figure 2:
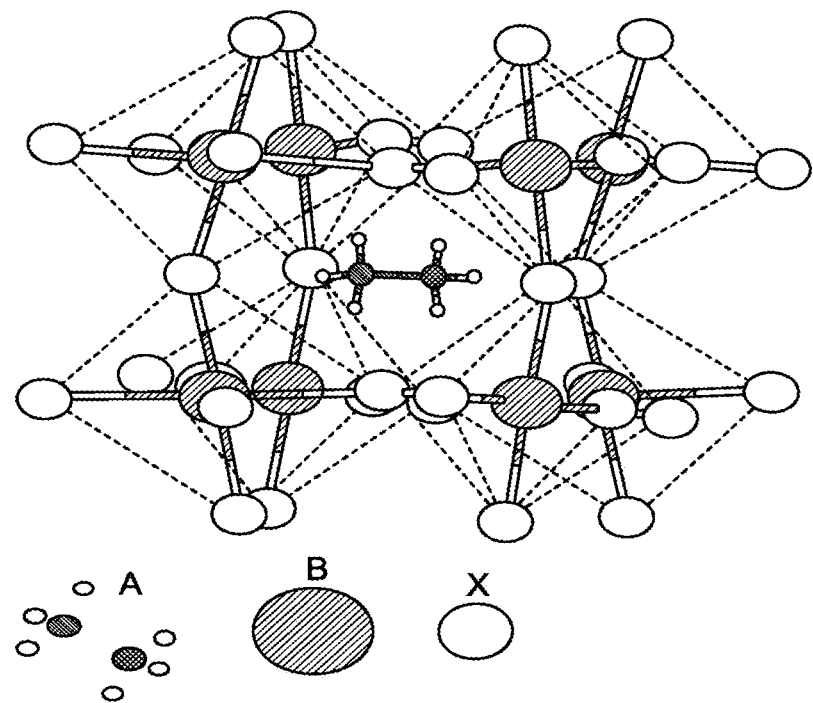
FIG. 2 is a schematic structure of a PVT having a generic form of $ABX_3$, according to certain embodiments.

FIG. 2 refers to a schematic structure of a PVT having a generic form of $ABX_3$, where $A^+$ is a monovalent cation such as methylammonium ($MA^+$:$CH_3NH_3^+$), formamidinium ($FA^+$:$HC(NH_2)_2^{2+}$), cesium ($Cs^+$), rubidium ($Rb^+$) or corresponding alloys. $B^{2+}$ is a divalent metal cation that includes $Pb^{2+}$, $Sn^{2+}$, or $Ge^{2+}$ or corresponding mixtures, and $X^-$ is a halide anion such as $Cl^-$, $Br^-$, $I^-$ or corresponding combinations.

Figure 3:
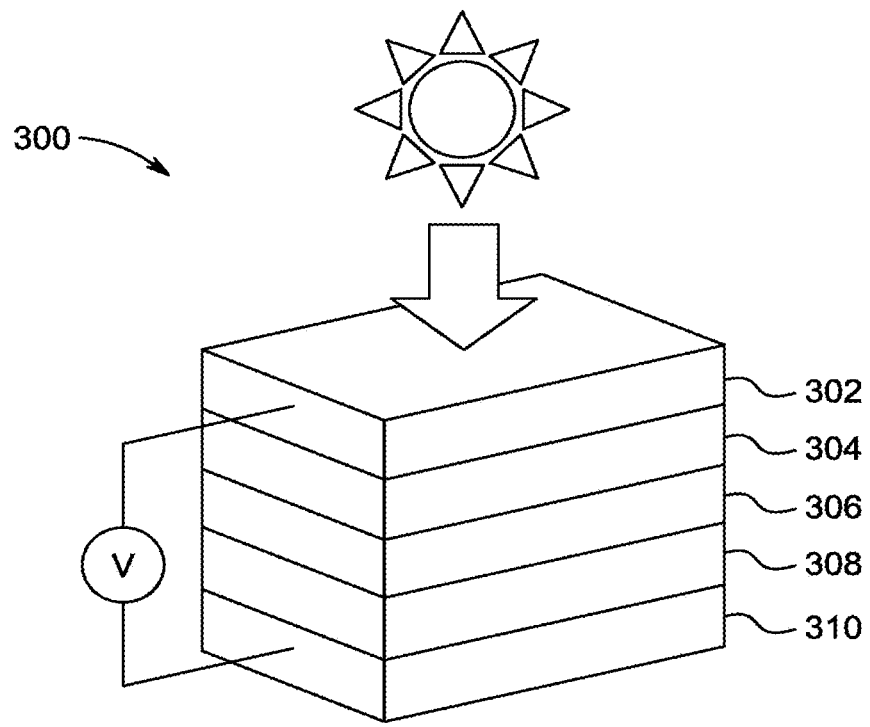
FIG. 3 is a schematic diagram of a PVT/Si tandem structure, according to certain embodiments.

FIG. 3 refers to a schematic diagram of a PVT/Si tandem structure 300. The PVT/Si tandem structure 300 includes a TCO layer 302, a PVT top sub-cell 304, an interlayer 306, a bottom silicon sub-cell 308, and a cathode 310. In PSCs, an ETL, and a HTL are used on either side of a PVT layer to extract electrons and holes, respectively. The PVT layer absorbs the solar spectrum only up to ~800 nm wavelength ($\lambda$) and has a stability issue against UV radiation, temperature, and moisture. Therefore, to utilize solar spectrum beyond 800 nm, hence, the tandem configuration of PVTs had been developed in combination with Si and copper indium gallium selenide (CIGS).

Figure 4:
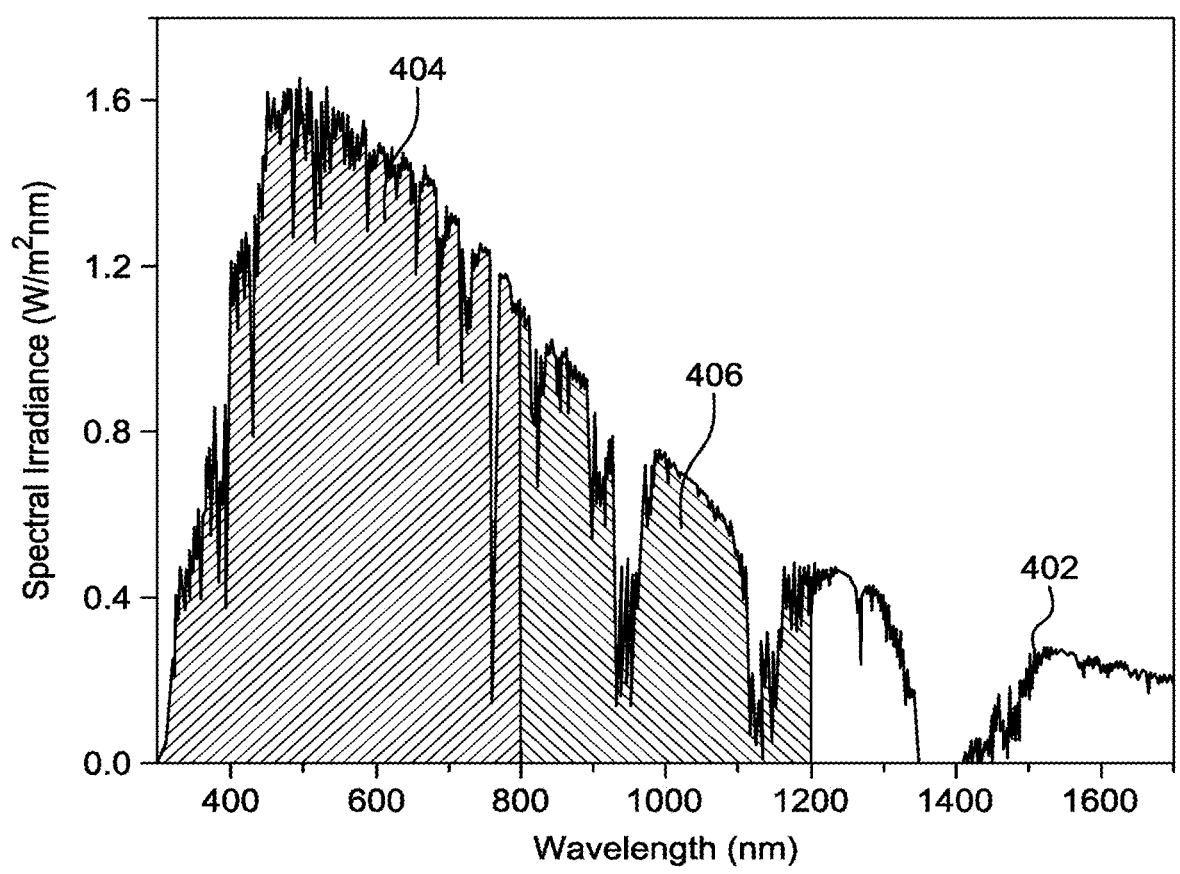
FIG. 4 is a graph depicting a spectrum irradiance response of PVT/Si TSCs, according to certain embodiments.

FIG. 3 shows that low wavelength photons are absorbed by the PVT top sub-cell 304, while the bottom silicon sub-cell 308 absorbs lower energy photons. FIG. 4 is a graph depicting a spectrum irradiance response of PVT/Si TSCs. The graph shows AM 1.5 standard spectrum 402, a PVT spectral irradiance 404, and a silicon spectral irradiance 406.

A PVT-based TSC was fabricated using Kesterite $Cu_2ZnSn(S, Se)_4$ as a bottom sub-cell and methylammonium lead triiodide ($MAPbI_3$) as a top sub-cell and achieved a f of 4.6%. In some embodiments, PVT/Si, PVT/CIGS, and PVT/PVT (all-PVTs) are developed. In the PVT/Si, PVT/CIGS, PVT solar cell is used as a front sub-cell which can be attributed to the semitransparent nature of PVT films. However, in the PVT/PVT tandem architecture, front and rear cells are based on PVT materials. Known S-Q limits of two-junction TSCs based on the PVT/Si, PVT/CIGS, and PVT/PVT are 44.3%, 44.1%, and 42.1%, respectively. PVT/Si and all-PVTs TSCs were efficiently developed, and efficiencies of >29% had been achieved for monolithic PVT/c-Si, 28.2% for PVT/Si-heterostructure, and 25.9% for PVT/CIGS TSCs. Known theoretical η of PVT/c-Si TSCs is 45.3%, and the energy conversion efficiency of practical devices is significantly lower than the theoretical η which can be attributed to various optical and electrical losses such as parasitic photon absorption, exciton dissociation, nonradiative recombination.

All-PVT TSC devices could be made on flexible and lightweight substrates via a cost-effective solution process. However, all solution process was not feasible for PVT/Si and PVT/CIGS TSCs. First, 2-terminal (2T) all-PVTs TSCs were fabricated using two sub-cells of $MAPbI_3$ with an efficiency known to be ~7%. The low device performance was attributed to the unavailability of low bandgap PVT materials. However, the development of mixed Pb—Sn-based narrow bandgap (1.18-1.3 eV) PVTs has enabled the fabrication of all-PVTs TSCs, in combination with Pb-based wide-bandgap PVT, and efficiencies over 25% have been already achieved.

Device Architecture

Figure 5A:
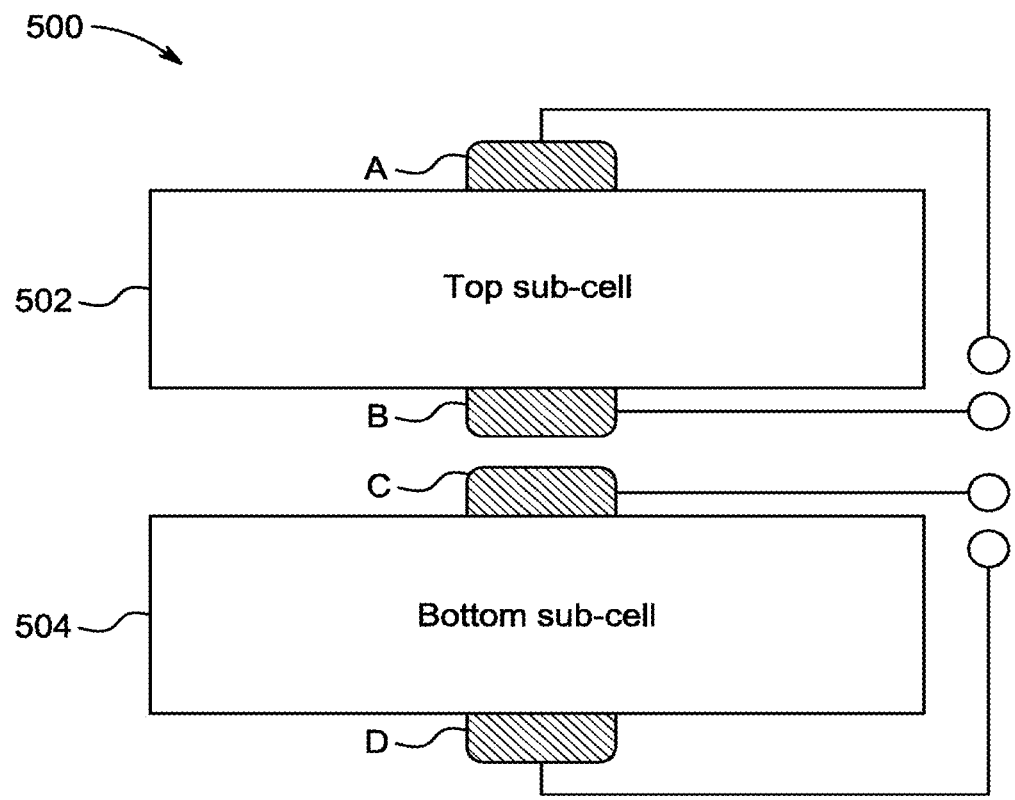
FIG. 5A is a schematic drawing of a 4 terminal (T) tandem cell, according to certain embodiments.

FIGS. 5A-5D shows schematic diagrams of various double-junction TSC architectures such as 2T, 3T, and 4T based on electrical connections to extract current from top and bottom sub-cells. In general, the PVT-based TSCs include 2T or 4T configurations. In FIG. 5A, if top sub-cell 502 and bottom sub-cell 504 function independently (current is extracted separately from the top sub-cell 502 and bottom sub-cell 504), then four terminals (A-D) are needed for current extraction. The resulting structure is referred to as a 4T tandem cell 500.

Figure 5B:
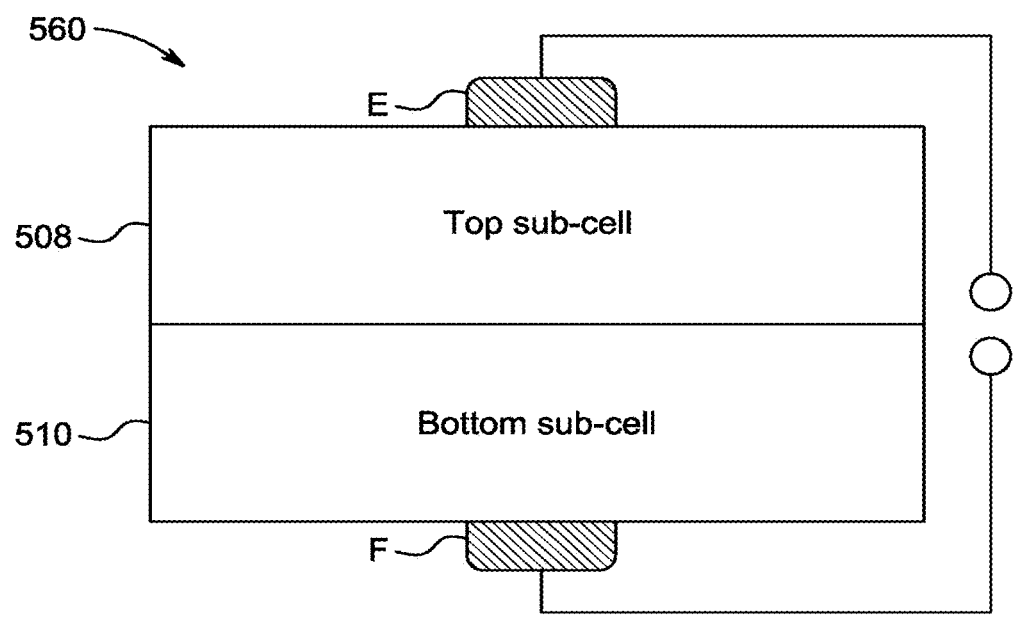
FIG. 5B is a schematic drawing of a 2T tandem cell, according to certain embodiments.

Further, as shown in FIG. 5B, if the top sub-cell 508 and bottom sub-cell 510 are monolithically interconnected, only two terminals, 'E' and 'F,' are required to extract the current. The resulting tandem structure is 2T tandem cell 560. In some embodiments, currents of two sub-cells of 2T tandems are matched for maximum output power ($P_m$).

In a 4T tandem cell, sub-cells are mechanically stacked or coupled with a spectrum-splitting dichromatic mirror. With extra transparent conductive oxide (TCO) layers, intricate interconnections, and separate inverters, the fabrication of the 4T configuration is expensive, producing low energy yield ($E_Y$) and higher losses. Conversely, in a 2T tandem cell, the sub-cells are fabricated successively on a single substrate and connected via an interconnection layer. The 2T cell mitigates optical and electrical losses which can be attributed to extra electrodes and minimizes the manufacturing cost. Furthermore, the 2T cell avoids lateral current flow through the TCO layer sandwiched between the sub-cells. Thus, only one inverter is used. However, the resultant output current is restricted by the sub-cell generating the lesser current. Hence, an optimal design may produce a maximum current by matching the short circuit current density ($J_{sc}$) value of both the sub-cells. Several methods such as variation of illumination intensity, environmental conditions (such as wind speed, temperature, dust), and an angle of incident light during the daytime may lead to a mismatch of the current of both the sub-cells, which may further reduce an output power ($P_m$) of 2T tandem devices. Thus, the rated value of the 2T-based TSCs cannot be achieved in practical application. To overcome such issues, a new concept was introduced, in which a common connection is introduced between sub-cells (FIG. 5C and FIG. 5D).

Figure 5C:
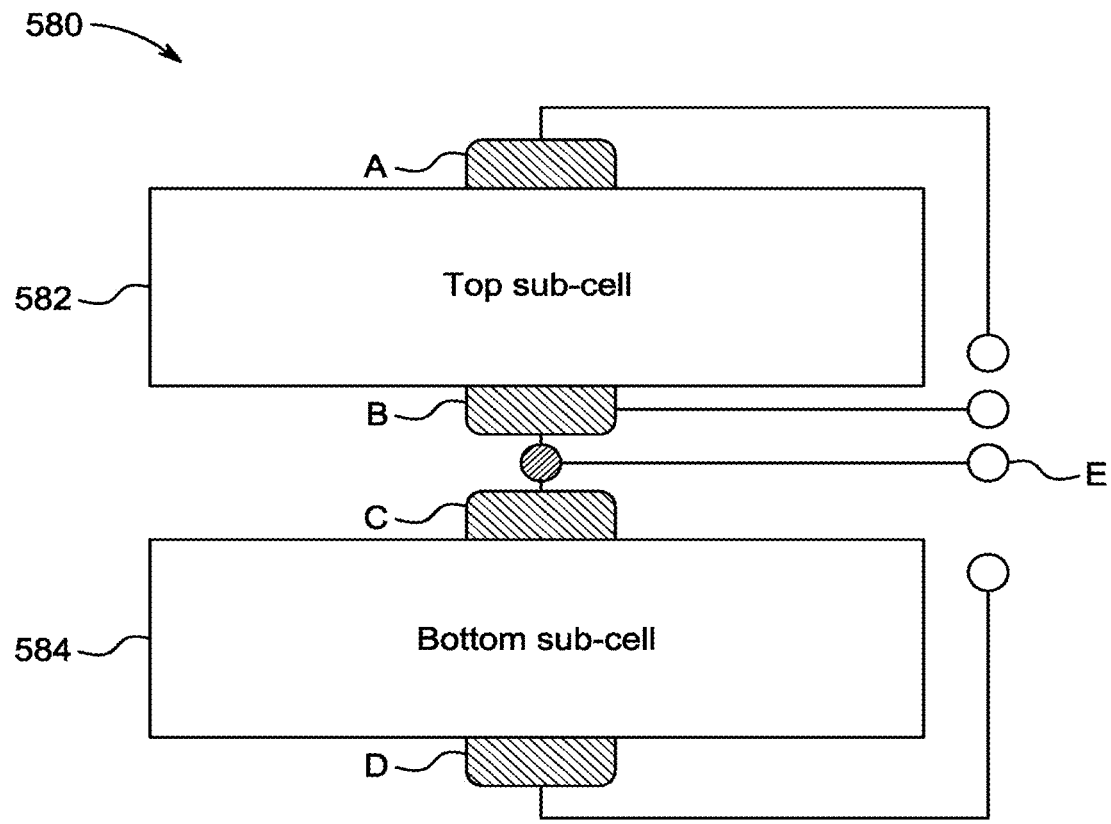
FIG. 5C is a schematic drawing of a first 3T tandem cell, according to certain embodiments.
Figure 5D:
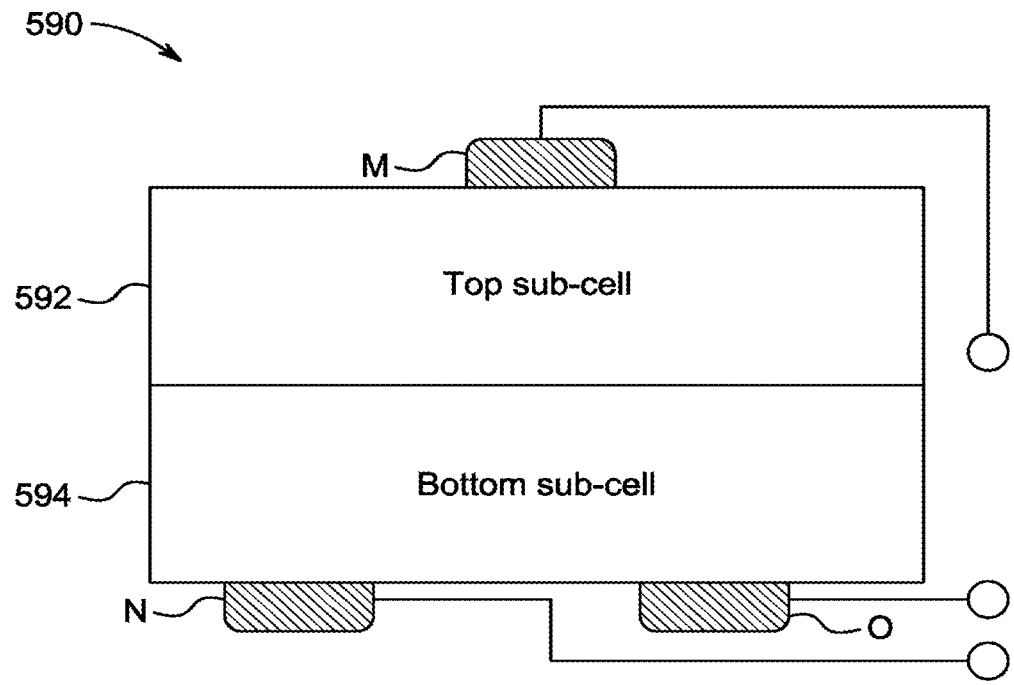
FIG. 5D is a schematic drawing of a second 3T tandem cell, according to certain embodiments.

FIG. 5C shows a schematic drawing of a first 3T tandem cell 580. The first 3T tandem cell 580 includes a first sub-cell 582 and a second sub-cell 584. The first sub-cell 582 includes a first terminal 'A' and a second terminal 'B'. The second sub-cell 584 consists of a top terminal 'C' and a bottom terminal 'D'. The second terminal 'B' and top terminal 'C' work as a single unit 'E'. The second terminal 'B' and top terminal 'C' are collectively referred to as the single term 'intermediate terminal' 'E'. FIG. 5D shows a schematic drawing of a second 3T tandem cell 590. The second 3T tandem cell 590 includes a first sub-cell 592 and a second sub-cell 594. The first sub-cell 592 includes a first terminal, 'M'. The second sub-cell 594 includes a second terminal 'N' and a third terminal 'O'. In a 3T tandem configuration, current matching of sub-cells is not essential. In 3T devices, both sub-cells are independently operated in a monolithic structure on a single substrate (either in the form of middle contact or integrated back contact), 3T tandem architecture resolves the issue associated with the current mismatch in 2T and higher optical losses and manufacturing cost of 4T.

2T Tandem Architecture

In 2T TSCs, the resultant $J_{sc}$ value is lower than the $J_{sc}$ value of individual sub-cells. However, open-circuit voltage ($V_{oc}$) adds up. A bifacial Si hetero-junction (SHJ)/PVT TSC decouples limitations associated with 4T PSCs and provides a state-of-the-art solution to achieve a high η via utilizing scattered light from ground. In some embodiments, sub-cells exhibit η of 33% in a bifacial configuration, exceeding that of a bifacial SJH with an intrinsic thin layer (HIT) at an albedo reflection. The present structure is similar to the traditional 2T TSC, but without a back contact, which leads to an enhancement in the η through harvesting reflected light from the ground. In some embodiments, the optical band gap ($E_g$) (~1.55 eV) of a top PVT sub-cell is considerably lower than the desired $E_g$ (~1.75 eV). In the present configuration, the top PVT sub-cell absorbs a number of photons that the bottom sub-cell would not be able to generate adequate $J_{sc}$, which results in a η quashing. Therefore, tuning of the PVT layer thickness is crucial for the desired design of a TSC with minimum $J_{sc}$ mismatch.

Properties and Influence of Tunnel Junction (TJ)

In some embodiments, a monolithic combination involves electrical coupling between top and bottom sub-cells. Moreover, tailoring absorption ranges of top and bottom sub-cells may be essential. In some embodiments, the top and bottom sub-cells were interconnected via an intermediate layer, including a band-to-band TJ. In some embodiments, the top and bottom sub-cells were interconnected via an intermediate layer which may include the RL. A thin metallic or TCO layer acts as a recombination site and can therefore be used as the RL. Hence, appropriate tunneling of the photogenerated charge carriers from one sub-cell to the other via the intermediate layer is essential with a little electrical/optical loss, ultimately reducing the device cost.

By combining improved light management with a high-quality PVT structure, about 22.7% conversion efficiency using a heavily doped hydrogenated nanocrystalline Si (nc-Si:H) tunneling layers on a heterojunction-with-intrinsic-thin-film (HIT) bottom sub-cell, was reported in the literature. Furthermore, the η of PVT/Si TSC reached to about 25.2% via insertion of a second nc-Si layer p+/n+TJ. The present improvement was achieved which may be attributed to the use of a more conductive recombination junction (RJ) and the reduction in the reflection losses, which lead to an enhancement in an irradiance response.

In some embodiments, to construct monolithic integrated bottom and top sub-cells in a 2T tandem architecture, only a single substrate was required, and fewer layers need to be deposited as compared to the mechanically stacked 4T configuration. Moreover, the 2T tandem architecture only uses 2 electrodes, one of which is transparent. Hence, the 2T tandem architecture includes a simple structure. Monolithic series interconnection of the 2T tandem architecture also allows the reduction of the series resistance losses, thus resulting in a higher practical efficiency potential.

However, the monolithic tandem configuration requires the adaptation of the two sub-cells and corresponding interconnection with the intermediate layer (TJ or RL). As the sub-cell restricts the total current in monolithic 2T tandems with the lower $J_{sc}$ the desired $J_{sc}$ value of both the sub-cells should be the same at maximum power point (MPP). The current-matching issue imposes relatively strict restrictions on the choice of absorbing materials for top and bottom sub-cells. Moreover, some bottom sub-cells (for example, a-Si/c-Si HIT cell) are temperature-se, implying that a top PVT cell should be processed at low temperatures.

2-Terminal Versus 4-Terminal Tandem Configurations

In 4T tandem devices, the two sub-cells are fabricated individually and mechanically stacked, which can operate independently. Such configuration has the apparent benefit of process straightforwardness. However, using the 4T tandem devices amplifies the cost of the power electronics, enhancing the cost of the PV module. On the contrary, the 2T tandem architecture employs fewer deposition steps, and only one transparent electrode was required (compared to 4T tandem architecture) which reduces the manufacturing cost. Thus, parasitic absorption was also slashed, which resulted in higher practical efficiency. Additionally, high $Vo_c$ (sum of two sub-cells) was obtained in the 2T TSC which is advantageous for high voltage devices. Moreover, the 2T tandem architecture structure offers low resistive loss in photovoltaic systems. However, the 2T tandem also has certain limitations. Both sub-cells should deliver nearly the same current during operating conditions. The sub-cell with the lesser current restricts the output current. Thus, the optimum $E_g$-range of the top sub-cell is narrowed (1.7 to 1.8 eV). The 2T TSCs are very sensitive to the solar spectrum and illumination intensity deviations. Therefore, a definite scheme is essential for the particular topographical site. Besides, the processing parameters of the top sub-cell fabrication are designated not to interrupt the performance of the bottom sub-cell. On the other hand, the bottom sub-cell was chosen as an appropriate substrate for the top sub-cell. The theoretical achievable efficiency for a SJ Si solar cell was about 33%. However, the theoretical limit is extended to about 43% for PVT/Si TSC for the 2T or 4T tandems). A wide gap between experimentally achieved and theoretical efficiency was observed for the 2T and 4T tandems devices.

Progress in 2T and 4T PVT/Si Tandems

The combination of PVT and Si in 2T and 4T TSCs has shown significant progress in recent years with prompt growth in the f. Considerable efforts were made to enhance the properties of materials while reducing the optical and electrical losses. Example 1: a two-terminal $MAPbI_3$-based PSC PVT solar cell was fabricated on top of a p-n junction crystalline Si solar cell (p++-Si/n-Si) along with $n^{++}$-Si tunnel (T) junction. Experimentally measured J-V characteristics provided a η of 13.7%.

Example 2: PVT/c-Si 2T TSC was established, which used a homo-junction c-Si as a bottom sub-cell. $TiO_x$ compact and mesoporous layers were used, which also act as the passivating layers for both the sub-cells. Thus, a high value of $V_{oc}$ was achieved. Furthermore, a textured structure was used on the top of the cell, resulting in a 2T TSC with 1 of 22.5%.

Example 3: η of 23.6% was achieved for PVT/Si 2T TSC via merging an infrared-tuned HIT bottom sub-cell with cesium-formamidinium lead halide PVT. LiF antireflection coating (ARC) was used on a top of the cell.

Example 4: Conversion efficiency of 25.5% was achieved for monolithic PVT/Si TSC by employing a textured foil on a top of the PVT/Si TSC TSC.

Example 5: 110 nm thick $SiO_x$ interlayers (refractive index=2.6 at 800 nm) were inserted between two sub-cells enhancing the $J_{sc}$ (1.4 mA/cm$^2$) of HIT bottom sub-cell. A total (top+bottom) $J_{sc}$ of 38.7 milliampere per square centimeter (mA/cm$^2$), and η of 25.2% were achieved.

Example 6: An efficiency of 25% had been initially reported for PVT/Si 2T TSC obtained by combining rear-junction SHJ bottom sub-cell with p-i-n PVT top sub-cell. Development of indium doped zinc oxide (IZO) front contact and PVT thickness was allowed for increased $J_{sc}$ value over 19.5 mA/cm$^2$ empowering the η of 26%. The J-V curves under various illumination spectra revealed that the decline in the $J_{sc}$ value was attributed to incomparable illumination somewhat recompensed by a fill factor (FF). Optical simulation results of the EQE showed that two significant damages in $J_{sc}$ of 3.30 and 4.65 mA/cm$^2$ were attributed to parasitic absorption and reflection losses, respectively.

Example 7: 25.4% power conversion efficiency was achieved with a high $V_{oc}$ value of 1.80 V by matching photocurrent ($I_{ph}$) between top and bottom sub-cells in 2T PVT/Si PSC. The improved photovoltaic performance had been accomplished by grain engineering of PVT layer through synergetic influence of MACl and $MAH_2PO_2$ additives. Such additives in the PVT precursor promote grain development and prolong charge carrier lifetime.

Example 8: A PVT layer coating on a pyramidal textured (<1 μm) c-Si bottom sub-cell using a blade coating was proposed. The nitrogen-assisted blading technique was used to coat a charge transport layer and the flattening PVT layer. The best $V_{oc}$ value of 1.82 V and a η of 26.0% were achieved. The η could be further improved via defect passivation of the PVT layer and by minimizing the parasitic absorption.

Figure 6:
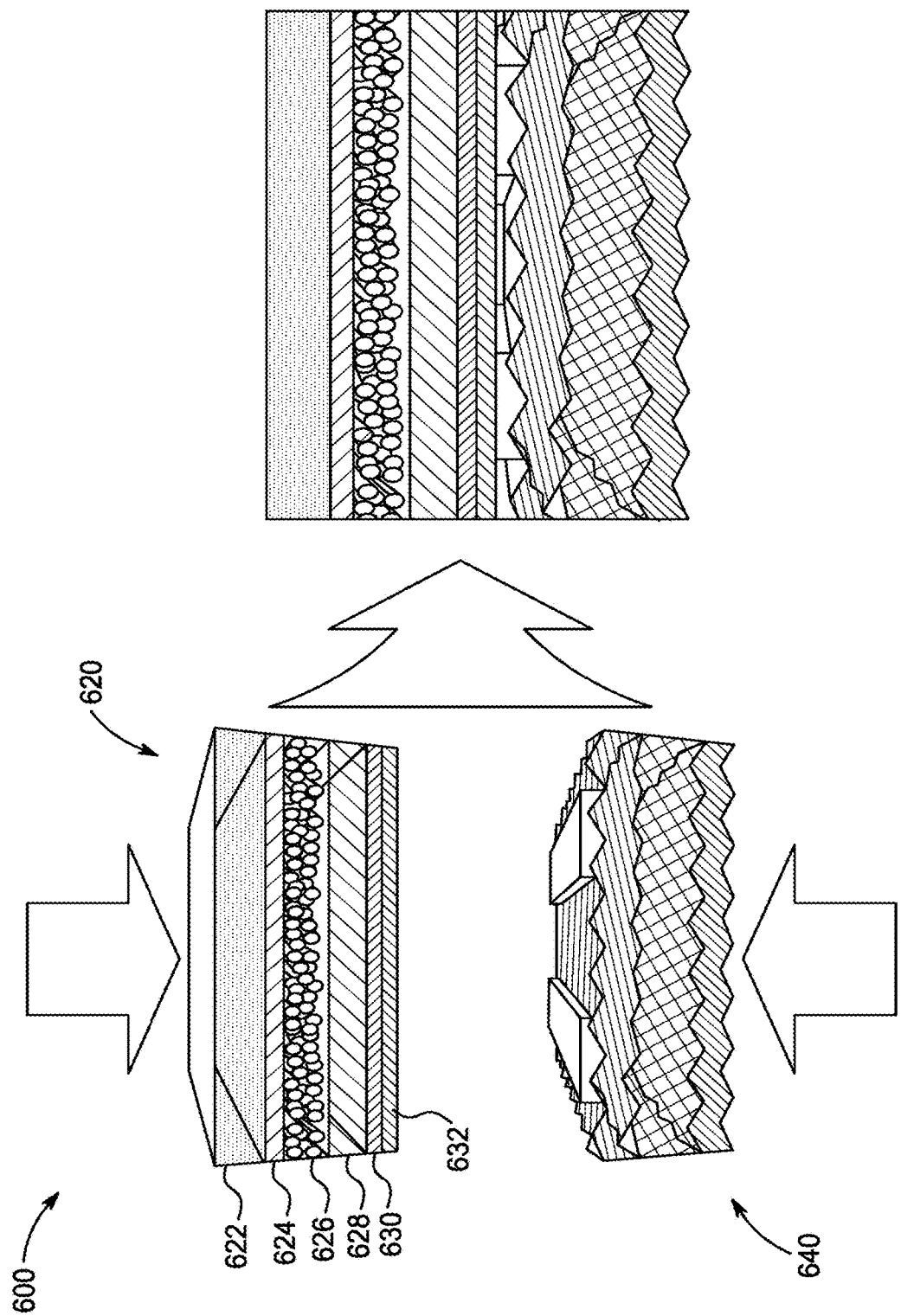
FIG. 6 is a schematic view of mechanically stacked, a graphene-based 2T PVT/Si TSC obtained by applying pressure over a contact area of sub-cells, according to certain embodiments.

In some embodiments, the 2T architecture has the advantage of reducing processing costs compared to the 4T; however, a direct deposition onto a textured surface of the Si bottom sub-cell is challenging. For example, FIG. 6 shows a simple mechanical stacking of 2T PVT/Si TSC 600. The 2T PVT/Si TSC 600 includes a PVT sub-cell 620 independently fabricated to a silicon bottom cell 640. The PVT sub-cell 620 includes a glass 622, c-TiO2 624, m-TiO2 626, a PVT 628, Spiro-OMeTAD/PTAA 630 and an ITO 632. The PVT 628 was deposited by a solution process. Further, the silicon bottom cell 640 includes front contact and a metal grid. The objective was to take the benefits of PSC and textured, c-Si, and SHJ sub-cells into 2T PVT/Si PSC. A champion tandem device exhibited an alleviated η of 25.9%. Such configuration used a larger cell area than the PSC (1.43 $cm^2$).

Further, PVT/SHJ 2T TSC was developed. A thick layer of PVT on a textured bottom sub-cell using a solution process. A certified η of 25.7% was accomplished via enhancing the depletion width at pyramidal textures along with passivated PVT layer. The obtained device was thermally stable and showed no significant η loss at 85 degrees Celsius (° C.) for 400 h.

Further, 4T PVT/Si TSC was developed which delivered η of 27.7%. Various aliphatic alkylammonium bulky cation layers were deposited on PVT film resulting in the formation on a surface of 3D PVT of a Ruddlesden-Popper 'quasi-2D' PVT phase allowing the passivation of the surface defects. A tandem η of 26.2% was reached by combining 1 $cm^2$ semitransparent PVT cell with 1 $cm^2$ passivated emitter rear locally-diffused solar cell (PERL) silicon cell.

Moreover, a fabrication of an efficient 2T PVT/Si PSCS was established. A PVT layer of large $E_g$ employing triple-halide alloys (Cl, Br, and I) was used. For the present process, illumination was needed. Solubility of the Cl was enhanced via substitution of I with the Br. Thus, a charge carrier lifetime and mobility were improved. An efficiency of 27% had been achieved with an area of 1 $cm^2$.

A combination of SHJ bottom sub-cell and PVT top sub-cell in a 2T PVT/SHJ TSC was also established. MA-free $FA_{0.75}Cs_{0.25}Pb$ $(I_{0.8}Br_{0.2})_3$ PVT layer was used in order to provide an efficient device stability, resulting in an enriched absorption close to the bandgap edge along with admirable PVT layer quality. The obtained TSC delivered an efficient FF of 80%, and certified f of 25.1%. An efficiency improvement was also observed for the TSC after storing the TSC in dark and under $N_2$ ambient for more than 5 months.

Further, an outdoor testing was also conducted for the 2T PVT/Si TSC with η of 25% in hot and sunny weather to elucidate the impact of the temperature on the PV performance. The temperature of the TSC reached ~60° C. in direct daylight. Moreover, the $E_g$ of PVT and Si follow opposite trends, which affects the current-matching conditions. The optimum Eg value of PVT is placed lower than 1.68 eV for the environmental temperature of 55° C.

3-Terminal Tandem Architecture

3T TSCs have been proposed and developed as an alternative to 2T and 4T configurations to overcome some limitations mainly related to the current collection or electrical isolation between layers. The 3T tandem architecture is compatible with the well-mastered silicon technology. In some embodiments, the 3T tandem architecture may be obtained by combining two 2T devices with a middle contact. In some embodiments, the 3T tandem architecture may be obtained by combining a 2T top sub-cell with a 3T bottom sub-cell with one front contact and two interdigitated back-contact (IBC). Such devices can be demonstrated in gallium arsenide phosphate/silicon germanium (GaAsP/SiGe) structure, amorphous silicon (a-Si) TSC, and polymer-based solar cell. In some embodiments, the 3T tandem may include PSCs.

In some embodiments, a characterization method of monolithically integrated PVT/Si TSC may be carried out using a 3T measurement architecture which includes a high bandgap methylammonium lead halide top sub-cell and a HIT bottom sub-cell. The 3T measurement architecture may involve an RL, which also serves as an extra current-collecting electrode. In some embodiments, the 3T measurement architecture allowed measuring the J-V characteristics and external quantum efficiency (EQE) of each sub-cell independently. A PCE of 23.5% was achieved by reducing reflection and absorption losses along with a precise current matching. Moreover, the developed architecture showed an efficient constancy by retaining 97% of the initial η after 100 days under open environments. In some embodiments, a simulation study was conducted to optimize the 3T PVT/silicon tandem structure with the objective of minimizing optical losses and determining the maximum achievable power conversion efficiency.

In some embodiments, parasitic absorption losses can be avoided when the HTL is located behind the PVT absorber, leading to a significant increase in total photocurrent density ($J_ph$) from 34.4 to 41.1 $mA/cm^2$. The simulations have also demonstrated that tandem efficiencies up to 32% can be obtained for np-np configuration with 1000 nm thick PVT layer in the 3T tandem configuration.

Figure 7A:
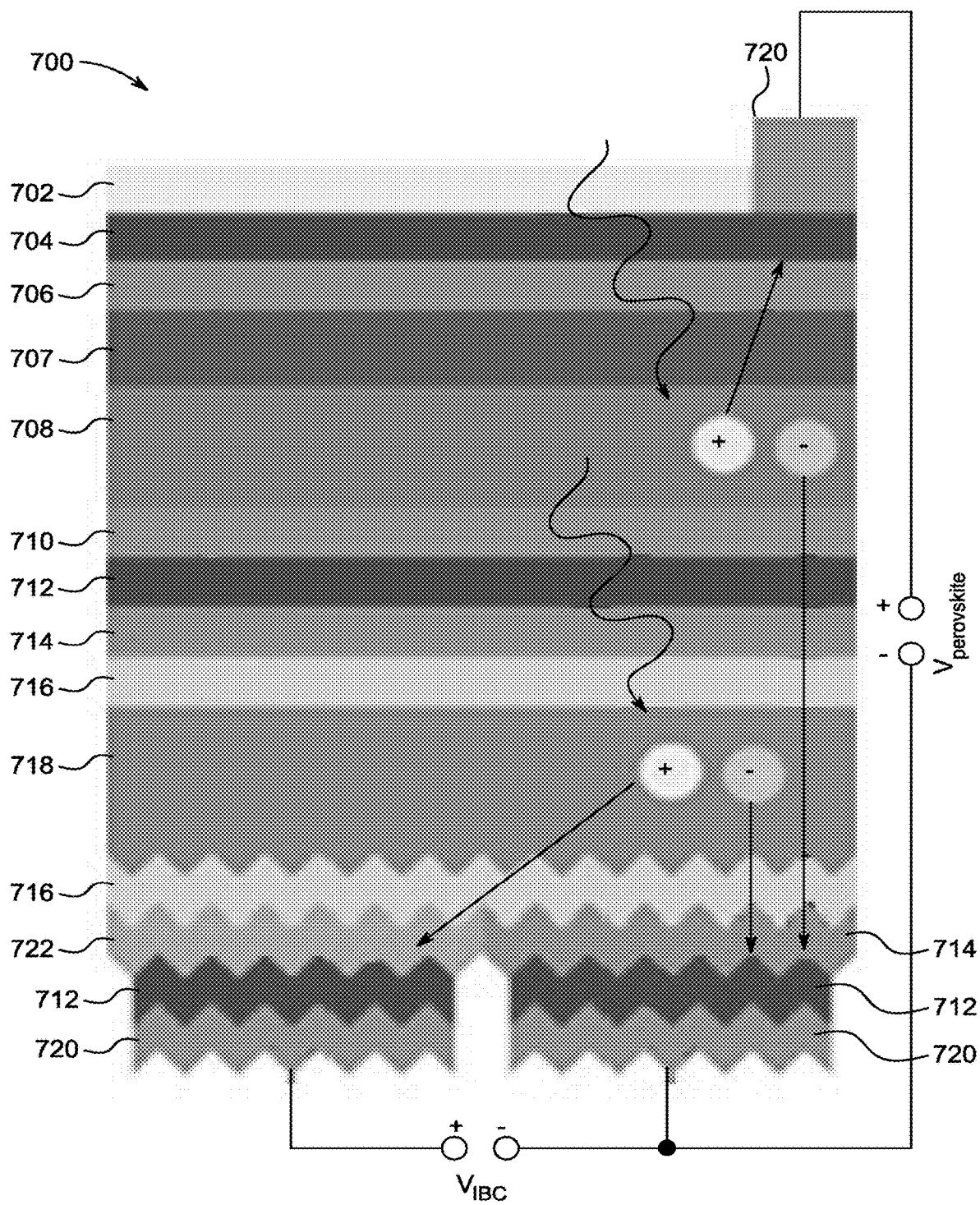
FIG. 7A is a schematic diagram of a 3T PVT/Si integrated back contact (IBC) TSC along with an operational mechanism, according to certain embodiments.

FIG. 7A shows a schematic drawing of a 3T tandem structure 700. The 3T tandem structure 700 includes layers of components such as LiF 702, IZO 704, $MeO_3$ 706, Spire-OMeTAD 707, PVT 708, $SaO_2$ 710, ITO 712, a-Si:H ($a^+$) 714, a-Si:H (i) 716, C—Si (a) 718, Ag 720 and a-Si:H (p+) 722, wherein $V_{IBC}$ is the measured voltage of the Ag 720 layer and $V_{perovskite}$ is the measured voltage of the PVT 708 layer. An approach is used to interconnect a top PVT sub-cell IBC SHJ in a 3T tandem structure. The present structure has eliminated a middle contact in the 3T configuration which may require lateral current collection between top and bottom sub-cells. An effectual charge carrier transportation through the entire TSC was therefore obtained. A drift-diffusion simulation revealed a potential η of ~27%. Furthermore, the proof-of-concept TSC has reached a combined stabilized η of 17.1% under the MPP condition. However, the measured bias-dependent J-V characteristics have shown a slight mutual dependence of both sub-cells, mainly which can be attributed to the combined series resistance ($R_s$) of bulk and n-emitter of the bottom sub-cell. Discrepancies between simulation and experimental results can be attributed to the parasitic absorption and reflection in the front-side contact layer stack and the large value of series resistance ($R_s$) on the shared n-contact. Also, the shading which was attributed to a metal frame of the front contact of the top sub-cell caused the lowing of the η of TSC.

Figure 7B:
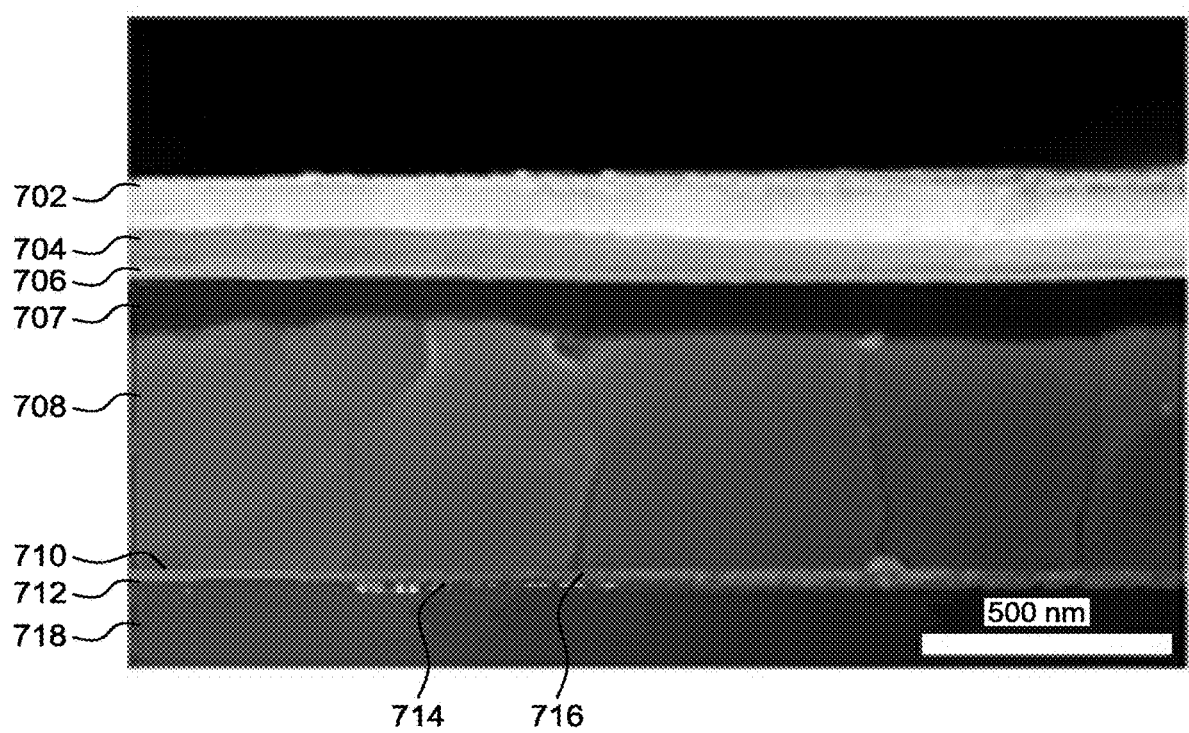
FIG. 7B is a cross-sectional scanning electron microscope (SEM) image of a top sub-cell, according to certain embodiments.

In some embodiments, 3T PVT-based TSCs include a combination of PVT solar cells with silicon back-contact solar cells using an internal barrier (selective band offset barrier) to allow the reduction of the thermalization process by isolating charged current carriers in different regions of the device. Numerical modeling was used to study the performance of such TSCs composed of an n-type IBC bottom sub-cell and a PVT top sub-cell with an organic front surface HTL and a standard PVT absorber, which was connected to the IBC by an ETL playing the role of selective band offset barrier. Preliminary simulation results of the current flow in the whole structure showed the role of the selective band offset barrier layer in repelling holes from the top sub-cell and preventing the corresponding thermalization in the bottom sub-cell. FIG. 7B shows a cross-sectional scanning electron microscope (SEM) image of the top sub-cell.

Advantages of 3T Tandem Architecture Over 2T and 4T Tandem Configurations

In 2T TSC, top and bottom sub-cells are interconnected in series, implying that the top and bottom sub-cells may have similar currents. However, in a practical device, variation in illumination and the incidence angle during the day created a current mismatch between the sub-cells. However, in 4T TSC, the top and bottom sub-cells were mechanically stacked and independently operated. Thus, the performance was not limited by the current mismatch between the top and bottom sub-cells. However, the 4T TSC required two extra ITO layers to extract the current from the sub-cells. The additional layer may induce significant parasitic absorption and reflection losses along with additional resistive losses. In a 3T TSC architecture, the current matching between top and bottom sub-cells is not necessary, which enables an increase in the thickness of the PVT absorbing layer, leading to higher $J_{ph}$ and hence improved η compared to a 2T TSC architecture. The 3T TSC configuration minimizes mutual electrical influence between the top and bottom sub-cells similar to the 4T architecture as the architecture has two separate hole contacts for the top and bottom sub-cells and a common middle contact for electrons. Since the top and bottom sub-cells are operated individually in a monolithically integrated 3T device, the architecture provides a solution to current-mismatch losses in the 2T configuration, and overcomes the optical losses in the 4T architecture. Moreover, compared to the 2T and 4T tandems, the η of the 3T configuration is less sensitive to the $E_g$ of the top and bottom sub-cells, which allows a higher flexibility in material choice.

Manufacturing the 2T TSCs has decreased up to 30% environmental impact equivalent to two SJ solar cells. The present decrease can be attributed to the 2T TSCs, which reduced the consumption of glasses. In some embodiments, a comparison between the environmental influences of Si, PSC, and PVT/Si tandem modules was carried out in order to assess global warming potential, human toxicity, freshwater eutrophication, freshwater ecotoxicity, and abiotic exhaustion of three PVT/Si TSCs. The PVT/Si TSCs had lesser environmental outcomes than environmental outcomes of the Si cells. The structure that presents the best environmental outcomes is the PVT/Si tandem using p-n junction Si solar cell (as an alternative of HIT), spiro-free PSC, and Al (as a substitute of Ag or Au) as a top electrode.

Technological and Economical

PVT and Si have shown a great potential as compatible partners to achieve high efficiency at little added costs over typical Si solar cells.

Light Management

In some embodiments, PVT/Si TSCs had shown efficient results with an efficiency record of 29.15%. However, to exceed 30% efficiency and go beyond the theoretical S-Q, one of the prerequisites is the development of an effective light management approach that can significantly reduce optical losses in the tandem structure. In particular, parasitic absorption related to the use of 2,20,7,70-Tetrakis[N, N-di(4-methoxyphenyl)amino]-9,90-spirobifluorene (Spiro-OMeTAD) (the mostly used HTL) and TCO can cause current loss which is a critical issue for the tandem efficiency. Hence, the parasitic absorption can be mitigated by using an alternative higher mobility materials such as IZO and hydrogenated indium oxide (H—$InO_x$). Additional losses can take place which can be attributed to optical interference effects, which can occur in a PVT sub-cell and to reflection at interfaces, thus contributing to the increase of current loss in the tandem structure. Hence, enhancing light trapping and minimizing reflections of a front surface to improve overall light harvesting in a tandem stack is an efficient method. The enhancement of a near response at a band edge, and the removal of the reflection losses can be achieved by surface texturing of c-Si wafers, and by avoiding the use of materials with low refractive indexes between the sub-cells. The vapor deposition process may be employed to deposit the PVT layers as the process may adapt to the strident topographies of textures of the bottom sub-cells.

Economic Prospects

In some embodiments, a bottom-up cost and uncertainty model was used to determine levelized cost of energy (LCOE) of 2T PVT/Si TSCs. Expensive charge transport materials such as [6,6]-phynyl-C61-butyricacid methyl ester (PCBM), PTAA, and Spiro-OMeOTAD may be replaced with cost-effective charge-transporting layers to minimize the LCOE of PVT/Si TSCs. Furthermore, the LCOE was further lessened by reducing the losses of the materials using a spin coating technique. In some embodiments, coating techniques such as screen-printing for the PVT and charge transporting layer formation can also be employed. In some embodiments, the cost was further reduced by using cost-effective CZ wafers in place of Float-zone (FZ) wafers. In some embodiments, the cost was reduced by using p-type wafers as an alternative of an n-type Si wafer. In some embodiments, the cost was reduced by using Si homo-junction instead of hetero-junction.

In some embodiments, in PVT/Si TSC, a bottom sub-cell contributes less than half of the total η of the TSC. Therefore, replacing c-Si with mc-Si has less impact on the device performance, however, LCOE can be greatly reduced. Thus, the LCOE of PVT/Si TSC was further lessened by using the mc-Si wafer along with cost-effective processing methodology, including wafer synthesis techniques, kerfless, and ingot casting. In some embodiment, 4T TSC configuration is efficient to replace expansive c-Si with mc-Si bottom sub-cell as PVT top sub-cell is first fabricated independently and then mechanically stacked with the bottom sub-cell.

Proposed TSC Structure

Figure 8:
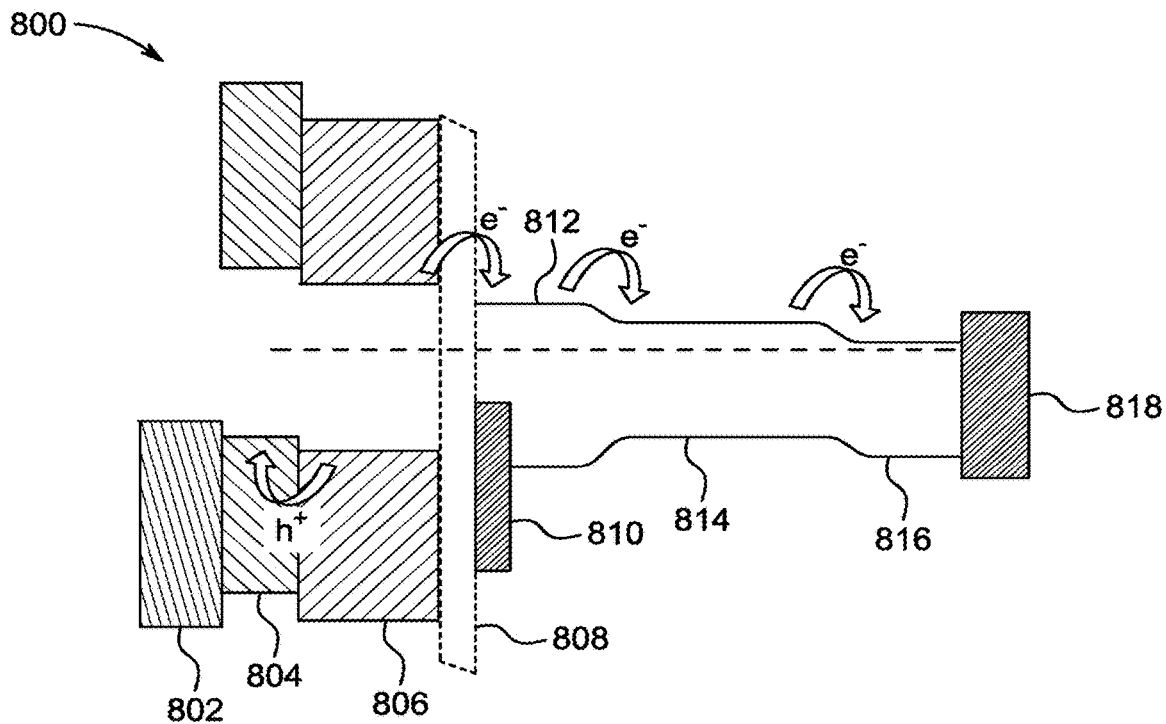
FIG. 8 is a schematic diagram of an exemplary PVT/Si TSC structure on an n-type Si wafer (c-Si or mc-Si) as a bottom sub-cell, according to certain embodiments.

FIG. 8 shows a schematic diagram of an exemplary PVT/Si TSC structure 800 on an n-type Si wafer (c-Si or mc-Si) as a bottom sub-cell. The PVT/Si TSC structure 800 includes a front transparent contact (FTC) 802, a HTL layer 804, a PVT layer 806, a TCO layer 808, a gridded metal contact 810, an ETL ($p^+$ doped and surface modified Si) layer 812, an n-Si layer 814, an $n^{++}$-Si layer 816, a back contact layer 818. Electrons ($e^-$) move from the PVT layer 806 towards the ETL ($p^+$ doped and surface modified Si) layer 812. Furthermore, protons ($h^+$) move from the PVT layer 806 to the HTL layer 804. With the proposed structure of the perovskite/silicon 3T tandem structures using 'middle contact' configuration, over 30% efficiency was feasible. Moreover, the efficiency was further improved using selective contact, and factors such as low-cost Si (CZ c-Si or mc-Si) solar cells used as bottom sub-cells can reduce the cost of tandem solar cells. Conduction and valence band edge at a front surface may be tuned via a surface modification. A modified silicon surface may be used as an ETL. Buried contact may be used for the current collection, which may further reduce the shadow losses. TCO (FTO or ITO) may be used as a recombination layer as well as middle contact. $SiO_x$ or $Al_2O_3$ layer can be used as a passivating layer. Bandgap and thickness may be flexible of perovskite top-cell, which can be attributed to no current mismatch. An inorganic perovskite layer may also be used. A highly diffused n++ junction may be formed on the rear surface of Si.

The PVT/Si TSC structure 800 provides advantages such as omission of several processing steps, parasitic absorption losses (attributed to interface layers) can be reduced; utilization of wide range photons for the current generation, omission of various interfacial layers leading to the reduction of the cost of the tandem cell; involvement of low-cost bottom sub-cells (CZ c-Si and mc-Si) also cut the cost of the tandem cell; the tandem cell includes a low environmental impact, addition of inorganic charge transporting layer has decreased the cost and has increased the stability of the tandem device; conversion efficiency of the TSC can be enhanced to >30%, thereby decreasing the overall cost of the tandem cell. Furthermore, direct entry of charge carriers to the Si leads to a reduction of resistive loss. Moreover, the current density of the tandem cell can also be enhanced. Surface modification of the Si enhances the $V_{oc}$. Overall $V_{oc}$ of the tandem cell is also increased. Various environmental conditions such as illumination and temperature maximize the output power ($P_m$). The patterned metallic contact of the bottom sub-cell along with the TCO layer can be used as middle contact for the current collection. In some embodiments, thickness or bandgap of a top sub-cell can be optimized.

Figure 9:
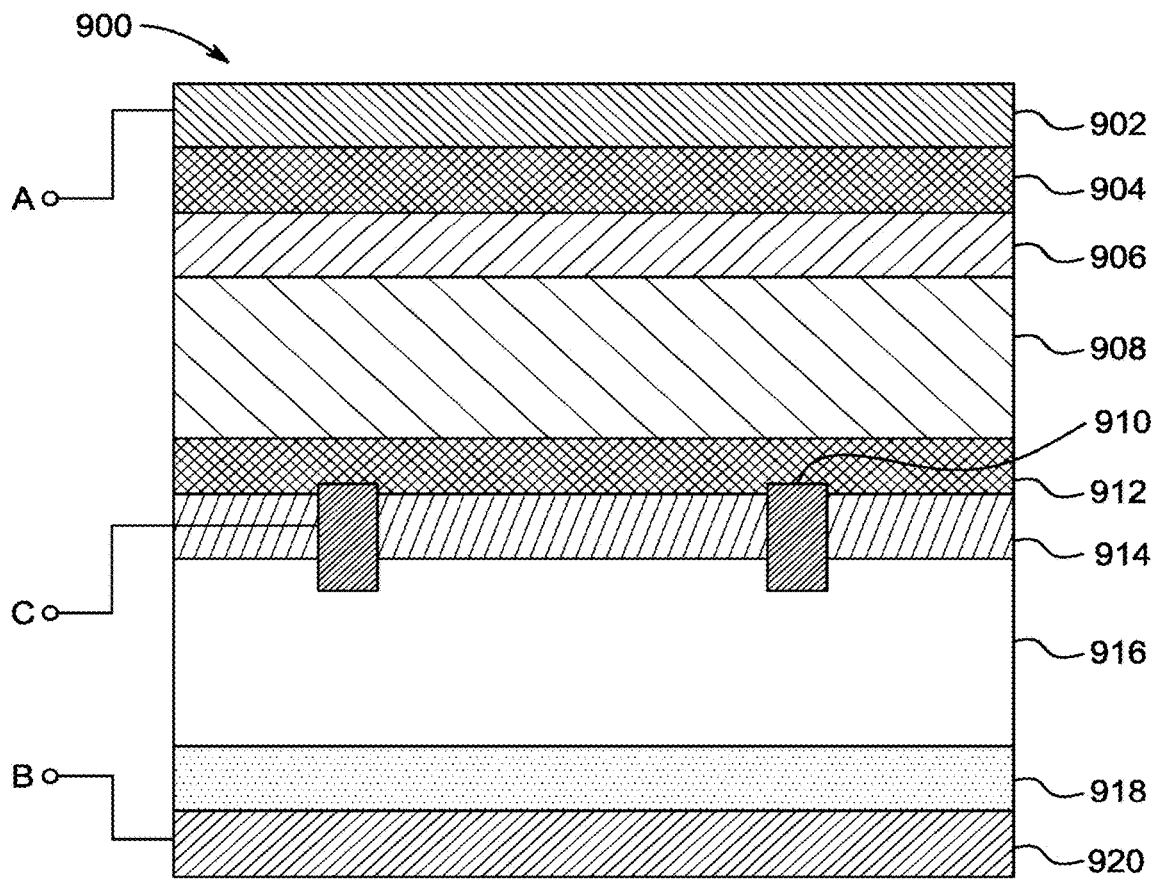
FIG. 9 is a schematic diagram of a proposed monolithic PVT/Si 3T tandem device concept for n-type wafer-based homo-junction silicon solar cell, according to certain embodiments.

Methodology for n-Type Si Wafer and 3T Perovskite/Silicon Tandem Cell Fabrication FIG. 9 is a schematic diagram of proposed monolithic PVT/Si 3T tandem device 900 for n-type wafer-based homo-junction silicon solar cell along with upconverters in point contact configuration. The monolithic PVT/Si 3T tandem device 900 includes an ARC layer 902, a first TCO layer 904, a HTL layer 906, a PVT layer 908, a buried contact 910, a second TCO layer 912, an ETL layer 914, an n-Si layer 916, an n+-Si 918, and a back contact layer 920, with the 3 terminals A-C. A polished or textured n-type Si wafer of resistivity 1-10 Ω-cm, and thickness of 200 μm was used as a starting material. The wafers were cleaned using a Radio Corporation of America (RCA) cleaning process. $SiO_2$ masks were grown via sputtering, atomic layer deposition, or thermal evaporation. Patterned windows were opened in the $SiO_2$ layer for point contact formation using lithography or nanolithography. The $SiO_2$ layer was removed in dilute hydrofluoric acid (HF) followed by standard cleaning. Front and backside of the wafer were simultaneously diffused using B-source and P-source to create p+/n junction and n/n+ (low-high) junction. A thin, porous silicon (PS) layer was grown using chemical or electrochemical routes. Pattern metallic contacts were prepared on a front surface Si bottom sub-cell. Full metallic contact was prepared on a rare side of the bottom sub-cell. $SiO_2$ or $Al_2O_3$ layer of about ~10 nm was deposited via atomic layer deposition (ALD) of sputtering techniques on PS. The PVT layer was deposited via a chemical vapor deposition (CVD), evaporation, or solution process. Further, HTM (NiO, NiO:Cu, or $WO_3$) was deposited via spin coating. Front contact of TCO (such as ITO or IZO) was deposited via thermal evaporation or sputtering.

Figure 10:
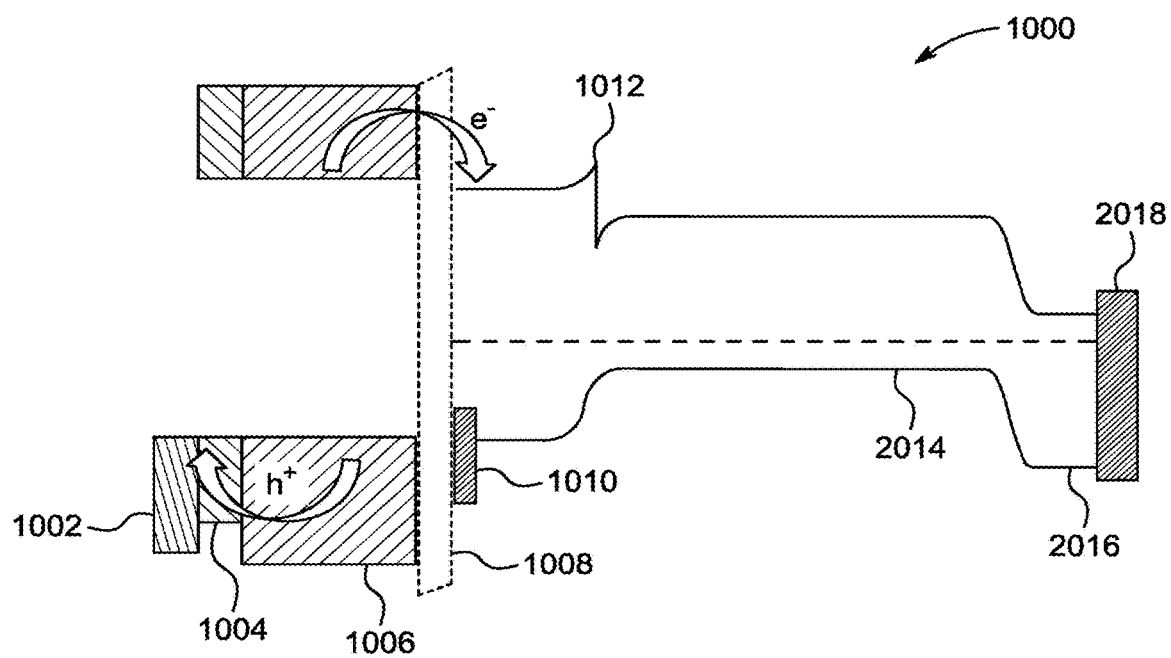
FIG. 10 is a schematic diagram of an exemplary PVT/Si TSC structure on a p-type Si (c-Si or mc-Si) wafer as a bottom sub-cell, according to certain embodiments.

FIG. 10 shows a schematic diagram of an exemplary PVT/Si TSC structure 1000 on a p-type Si (c-Si or mc-Si) wafer as a bottom sub-cell. The present structure includes a front contact (TCO) 1002, a HTL layer 1004, a PVT layer 1006, a TCO layer 1008, a gridded metal contact 1010, an ETL (p+-PS) layer 1012, a c-Si (p) layer 2014, a c-Si (n+) layer 2016, a back contact layer 2018. Electrons ($e^-$) move from the PVT layer 1006 to the ETL (p+-PS) layer 1012, and the protons ($h^+$) move from the PVT layer 1006 to the HTL layer 1004. The PVT/Si TSC structure on p-type Si (c-Si or mc-Si) wafer has similar advantages as that of the PVT/Si TSC structure on the an-type Si wafer (c-Si or mc-Si) and similar advantages with few changes, such as front and backside of the wafer were simultaneously diffused using B-source, and P-source to create n+/p junction and p/p+ (low-high) junction. Furthermore, long-wavelength photons were absorbed near p-n junction. Collection efficiency was increased.

Figure 11:
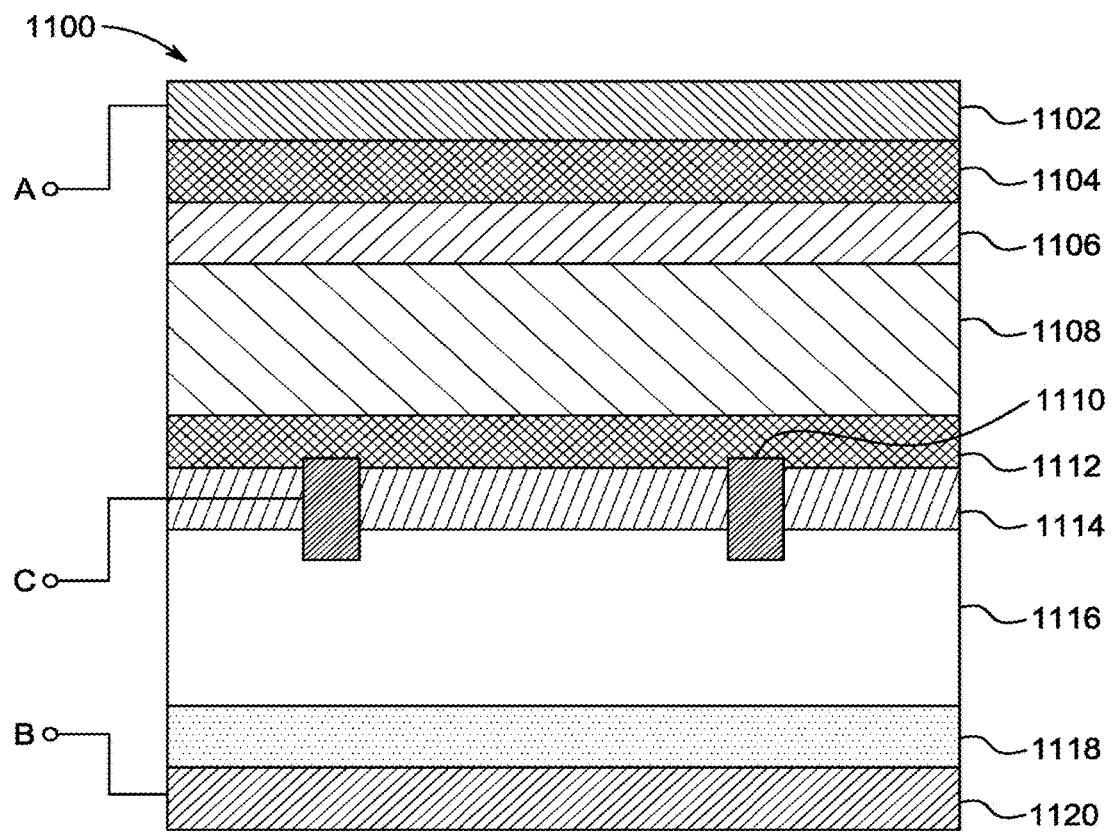
FIG. 11 is a schematic diagram of a proposed monolithic PVT/Si 3T tandem device concept for p-type wafer-based homo-junction silicon solar cell, according to certain embodiments.

FIG. 11 shows a schematic diagram of a proposed monolithic PVT/Si 3T tandem device 1100 for p-type wafer-based homo-junction silicon solar cell along with upconverters in point contact configuration. The monolithic PVT/Si 3T tandem device 1100 includes an ARC layer 1102, a first TCO layer 1104, a HTL layer 1106, a PVT layer 1108, a buried contact 1110, a second TCO layer 1112, an ETL layer 1114, a p-Si layer 1116, an n+-Si 1118, and a back contact layer 1120 and terminals A-C.

The present disclosure provides an efficient and ergonomic solar cell. The PVTs provides flexibility, wide area, lightweight, and cost-effective solution processed PV technology. The PVTs have unique optoelectrical properties including strong optical absorption, low exciton binding energies, long diffusion lengths (>1 μm), large carrier lifetimes, high charge carrier mobility, low trap densities, and high defect tolerance. The optoelectrical properties of the PVT active layer can be tailored through variations of organic cation and halide anion. The capability of the PVT materials makes the PSCs an efficient candidate for the front sub-cells in the tandem architecture.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A solar cell having a porous silicon layer, wherein the solar cell is a three-tandem perovskite/silicon tandem solar cell, comprising:
    an antireflection coating (ARC);
    a first transparent conductive oxide layer (TCO), wherein the ARC is adjacent and above the first TCO;
    a hole transport layer (HTL), wherein the TCO is adjacent and above the HTL;
    a perovskite (PVT) layer, wherein the HTL is adjacent and above the PVT layer;
    a second transparent conductive oxide layer (TCO), wherein the PVT layer is adjacent and above the second TCO;
    an electron transport layer (ETL) comprising a porous silicon, wherein the second TCO layer is adjacent and above the ETL;
    a plurality of buried contacts, wherein the buried contacts comprise silicon nanowires and are disposed in and pass through the ETL into the second TCO and into a p-type Si layer;
    a p-type wafer-based home junction silicon solar cell with the buried contacts being in point contact configuration with the ETL, wherein the ETL is adjacent and above the p-type silicon solar cell;
    a $n^+$ silicon layer, wherein the p-type silicon solar cell is adjacent and above the $n^+$ silicon layer;
    a back contact layer, wherein the $n^+$ silicon layer is adjacent and above the back contact layer, which uses an internal thermal barrier; and wherein the three-tandem perovskite/silicon tandem solar cell has a top sub-cell, a bottom sub-cell and a middle contact-based tandem;

wherein the top sub-cell includes the PVT layer;

the bottom sub-cell includes the silicon solar cell; and the middle contact-based tandem includes the second TCO layer; and a conduction and a valence band edge are at a front surface of the ETL;

the porous silicon is on a surface of the silicon solar cell; and a porosity of the porous silicon is from 2.5 to 22.5 vol %.

2. The solar cell of claim 1, wherein the bottom sub-cell comprises a CZ crystalline silicon (CZ c-Si).

3. The solar cell of claim 1, wherein the bottom sub-cell comprises a multi-crystalline silicon (mc-Si).

4. The solar cell of claim 1, wherein the first and second TCO layers are fluorine or indium doped tin oxide (FTO or ITO).

5. The solar cell of claim 1, wherein the first TCO layer is a hydrogenated indium oxide.

6. The solar cell of claim 1, wherein the top sub-cell includes an organic or inorganic perovskite.

7. The solar cell of claim 1, wherein the PVT layer comprises one or more perovskites having a formula $ABX_3$;

wherein A is a monovalent cation selected from the group consisting of methylammonium (MA':$CH_3NH_3$'), formamidinium (FA':$HC(NH_2)_2$'), cesium (Cs'), and rubidium ($Rb^+$); B is a divalent metal cation selected from the group consisting of $Pb^{2+}$, $Sn^{2+}$, and $Ge^{2+}$, and X is a halide anion selected from the group consisting of $Cl^-$, $Br^-$, and $I^-$.

8. The solar cell of claim 1, wherein the porous silicon uses an optical band-edge shifting property to directly extract light-generated charge carriers.

9. The solar cell of claim 1, wherein the second TCO layer has a gridded metal contact disposed adjacent to a surface of the second TCO layer.

10. The solar cell of claim 1, wherein the p-type silicon solar cell has a resistivity of from 1 (ohm-centimeters) Ω-cm to 10 Ω-cm.

11. The solar cell of claim 1, wherein the p-type silicon solar cell has a thickness of from 175 micrometers (μm) to 225 μm.

12. The solar cell of claim 1, further comprising at least one of a $SiO_2$ layer or $Al_2O_3$ layer on the porous silicon.

13. The solar cell of claim 12, wherein the $SiO_2$ or $Al_2O_3$ layer is at most 10 nanometers (nm).

14. The solar cell of claim 1, wherein the HTL comprises a hole-transmitting material (HTM).

15. The solar cell of claim 14, wherein the HTM is selected from the group consisting of NiO, NiO:Cu, and $WO_3$.

* * * * *